United States Patent
Shiobara et al.

(10) Patent No.: US 10,468,614 B2
(45) Date of Patent: Nov. 5, 2019

(54) PHOTOELECTRIC CONVERSION ELEMENT, IMAGE PICK-UP ELEMENT, AND IMAGE PICK-UP APPARATUS

(71) Applicant: CANON KABUSHIKI KAISHA, Tokyo (JP)

(72) Inventors: Satoru Shiobara, Funabashi (JP); Naoki Yamada, Inagi (JP); Tetsuo Takahashi, Kawasaki (JP); Jun Kamatani, Tokyo (JP); Yosuke Nishide, Kawasaki (JP); Hirokazu Miyashita, Tokyo (JP); Tomona Yamaguchi, Tokyo (JP); Hironobu Iwawaki, Yokohama (JP); Hiroki Ohrui, Kawasaki (JP); Masumi Itabashi, Yamato (JP); Norifumi Kajimoto, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 36 days.

(21) Appl. No.: 15/806,004

(22) Filed: Nov. 7, 2017

(65) Prior Publication Data

US 2018/0138432 A1    May 17, 2018

(30) Foreign Application Priority Data

Nov. 11, 2016    (JP) .................. 2016-220715

(51) Int. Cl.
*H04N 5/378* (2011.01)
*H01L 51/42* (2006.01)
(Continued)

(52) U.S. Cl.
CPC ............ *H01L 51/42* (2013.01); *H01L 27/307* (2013.01); *H01L 51/0046* (2013.01);
(Continued)

(58) Field of Classification Search
CPC . H01L 51/42; H01L 51/0059; H01L 51/0057; H01L 51/0068; H01L 51/0046;
(Continued)

(56) References Cited

U.S. PATENT DOCUMENTS

2010/0089452 A1*    4/2010    Suzuki .................. B82Y 10/00
                                                                        136/263

FOREIGN PATENT DOCUMENTS

JP        2007088033 A      4/2007
JP        2010183060 A      8/2010

OTHER PUBLICATIONS

Ruoff, Rodney S., Karl M. Kadish, Pierre Boulas, and E. C. M. Chen. "Relationship between the Electron Affinities and Half-Wave Reduction Potentials of Fullerenes, Aromatic Hydrocarbons, and Metal Complexes." The Journal of Physical Chemistry 99.21 (1995):8843-850, Feb. 7, 1995 (Year: 1995).*

* cited by examiner

Primary Examiner — Mekonnen D Dagnew
(74) Attorney, Agent, or Firm — Canon USA, Inc., IP Division

(57) ABSTRACT

The present disclosure provides a photoelectric conversion element including a lower electrode, a photoelectric conversion layer, and an upper electrode in this order; a voltage is applied between the lower electrode and the upper electrode; the photoelectric conversion layer contains a first organic compound and a second organic compound; the first organic compound has a lower oxidation potential than the second organic compound, and ΔE represented by the following formula (A) satisfies the following formula (B); where ΔE=oxidation potential of first organic compound−reduction potential of second organic compound (A)

$$\Delta E \geq 1.79 [V] \qquad (B).$$

12 Claims, 7 Drawing Sheets

(51) Int. Cl.
*H01L 27/30* (2006.01)
*H01L 51/00* (2006.01)
*H04N 5/38* (2006.01)

(52) U.S. Cl.
CPC ...... *H01L 51/0054* (2013.01); *H01L 51/0057* (2013.01); *H01L 51/0059* (2013.01); *H01L 51/0068* (2013.01); *H01L 51/0069* (2013.01); *H01L 51/0071* (2013.01); *H01L 51/0085* (2013.01); *H04N 5/378* (2013.01); *H04N 5/38* (2013.01); *H01L 51/0058* (2013.01); *H01L 51/0061* (2013.01); *H01L 51/4246* (2013.01); *H01L 51/4253* (2013.01); *H01L 51/4273* (2013.01); *H01L 2251/552* (2013.01); *Y02E 10/549* (2013.01)

(58) Field of Classification Search
CPC ............. H01L 51/0054; H01L 51/0069; H01L 27/307; H01L 51/0085; H01L 51/0071; H01L 51/0061; H01L 51/4246; H01L 51/4253; H01L 51/4273; H01L 2251/552; H01L 51/0058; H04N 5/378; H04N 5/38; Y02E 10/549
See application file for complete search history.

PHOTOELECTRIC CONVERSION ELEMENT, IMAGE PICK-UP ELEMENT, AND IMAGE PICK-UP APPARATUS

BACKGROUND OF THE INVENTION

Field of the Invention

The present disclosure relates to a photoelectric conversion element, an image pick-up element, and an image pick-up apparatus.

Description of the Related Art

Solid-state imaging elements that include a photoelectric conversion layer containing an organic compound are under development. These solid-state imaging elements have a structure on a signal readout substrate.

Various structures are known to reduce dark current in photoelectric conversion elements. Japanese Patent Laid-Open No. 2010-183060 (hereinafter referred to as Patent Literature 1) discloses an organic photoelectric conversion element including an electron-blocking layer between a photoelectric conversion layer and an anode. The energy level relationship between the photoelectric conversion layer and the electron-blocking layer and the thickness of the electron-blocking layer are specified to reduce dark current.

Japanese Patent Laid-Open No. 2007-088033 (hereinafter referred to as Patent Literature 2) discloses an organic photoelectric conversion element including a hole-blocking layer between a photoelectric conversion layer and a cathode. The energy level relationship between the photoelectric conversion layer and the hole-blocking layer is specified to reduce dark current.

Dark current in a photoelectric conversion element includes dark current generated in a photoelectric conversion layer as well as electric current from the anode and cathode.

Patent Literature 1 and Patent Literature 2 do not describe or suggest dark current generated between a p-type organic semiconductor material and an n-type organic semiconductor material in a photoelectric conversion layer. Thus, the photoelectric conversion element has insufficiently reduced dark current.

SUMMARY OF THE INVENTION

Accordingly, the present disclosure provides an organic photoelectric conversion element that generates reduced dark current between a p-type organic semiconductor material and an n-type organic semiconductor material in a photoelectric conversion layer of the photoelectric conversion element.

According to one aspect of the present disclosure, a photoelectric conversion element includes a lower electrode, a photoelectric conversion layer, and an upper electrode in this order. A voltage is applied between the lower electrode and the upper electrode. The photoelectric conversion layer contains a first organic compound and a second organic compound. The first organic compound has a lower oxidation potential than the second organic compound, and $\Delta E$ represented by the formula (A) satisfies the formula (B).

$\Delta E$=oxidation potential of first organic compound−
    reduction potential of second organic compound     (A)

$\Delta E \geq 1.79 [V]$     (B)

Further features will become apparent from the following description of exemplary embodiments with reference to the attached drawings.

DESCRIPTION OF THE EMBODIMENTS

The present disclosure relates to a reduction in dark current in a photoelectric conversion element including a photoelectric conversion layer containing an organic compound. Separation of electric charges generated between two types of organic compounds in a photoelectric conversion layer can be suppressed to reduce dark current.

[Structure of Photoelectric Conversion Element]

The present embodiment describes a photoelectric conversion element including a photoelectric conversion layer between an anode and a cathode. The photoelectric conversion layer contains an organic compound.

The photoelectric conversion layer of the photoelectric conversion element generates electric charges depending on the amount of light received. On absorption of light, the photoelectric conversion layer separates electric charges into holes and electrons and thereby converts light into an electric signal. The photoelectric conversion layer may contain multiple types of organic compounds. A random mixture layer of a donor material carrying positive charges and an acceptor material carrying negative charges in a photoelectric conversion layer is referred to as a bulk heterojunction.

Multiple types of organic compounds, if present at all, in the photoelectric conversion layer may be mixed in a single layer or may be contained in multiple layers.

The photoelectric conversion layer may contain a p-type organic semiconductor or an n-type organic semiconductor. At least part of the photoelectric conversion layer may contain a bulk hetero layer containing a mixture of an organic p-type compound and an organic n-type compound. The hetero layer may also be referred to as a mixed layer.

A photoelectric conversion layer including a bulk hetero layer has high photoelectric conversion efficiency. With a bulk hetero layer with an appropriate mixing ratio, the photoelectric conversion layer has high electron mobility and hole mobility, and therefore the photoelectric conversion element has a high photoresponse speed. Thus, the bulk hetero layer may have an optimum mixing ratio. [$\Delta E$]

$\Delta E$ is an energy gap defined by the following formula (A).

$\Delta E$=oxidation potential of first organic compound−
    reduction potential of second organic compound     (A)

$\Delta E$ satisfies the following formula (B).

$\Delta E \geq 1.79 [V]$     (B)

Figure 1:
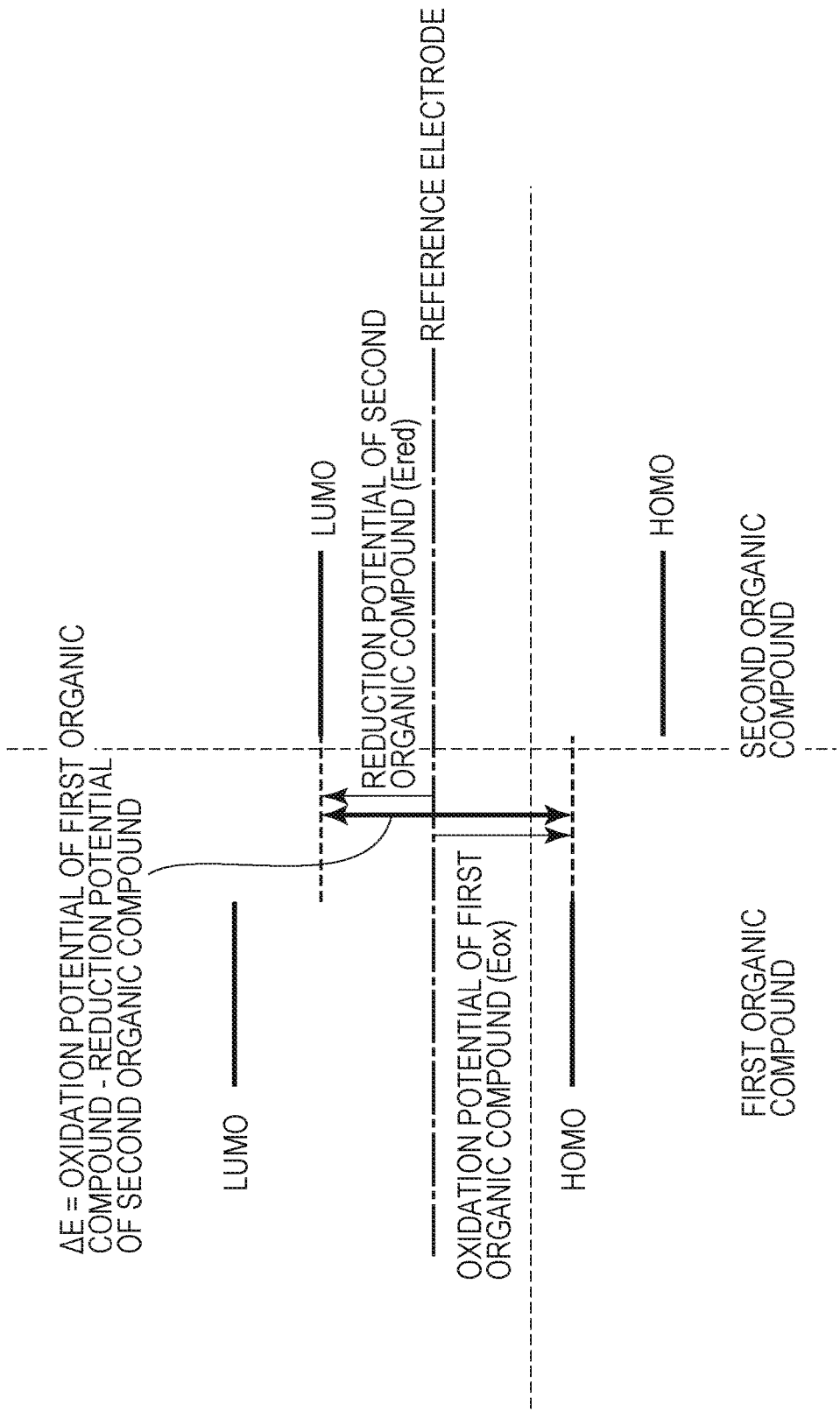
FIG. 1 is an energy diagram of $\Delta E$ according to an embodiment of the present disclosure.

FIG. 1 is an energy diagram of $\Delta E$. The oxidation potential of the first organic compound corresponds to the highest occupied molecular orbital (HOMO) of the first organic compound. The reduction potential of the second organic compound corresponds to the lowest unoccupied molecular orbital (LUMO) of the second organic compound. The redox potential is the difference in potential energy between molecules in the solution and the electrode and is a physical property of the molecules alone.

Dark current may be generated by thermal charge separation from a p-type organic semiconductor material to an n-type organic semiconductor material. ΔE is the energy required to generate dark current by thermal charge separation.

Satisfying the formula (B) can reduce the generation of dark current due to charge separation resulting from thermal excitation rather than optical excitation.

This is because ΔE correlates with the activation energy of dark current generation. Satisfying the formula (B) increases the activation energy of dark current generation and thereby reduces dark current generation due to thermal excitation, thus reducing dark current in the photoelectric conversion element.

Dark current due to thermal excitation results from a contact between molecules of a p-type organic semiconductor and an n-type organic semiconductor that form bulk heterojunction.

In addition to satisfying the formula (B), an organic compound that has less contact with other molecules or an organic compound that reduces thermoelectron generation in the photoelectric conversion layer can reduce dark current.

In the photoelectric conversion element according to the present embodiment, the photoelectric conversion layer contains a first organic compound and a second organic compound. The first organic compound has less contact with other molecules or reduces thermoelectron generation. Thus, the photoelectric conversion element has reduced dark current.

The photoelectric conversion layer contains the first organic compound and the second organic compound. The first organic compound is an electron donor material, and the second organic compound is an acceptor material.

The first organic compound is a p-type organic semiconductor in the photoelectric conversion layer. The first organic compound is a donor organic semiconductor and has electron-donating properties. More specifically, the first organic compound has a lower oxidation potential out of the two organic compounds. Thus, the first organic compound is an electron donor material, and the second organic compound is an electron acceptor material.

The first organic compound preferably has an oxidation potential of 0.96 V or more in consideration of the electron donor function.

Examples of the first organic compound include, but are not limited to, triarylamine compounds, pyran compounds, quinacridone compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and metallic complexes having a nitrogen-containing heterocyclic compound as a ligand. In particular, the first organic compound can be a triarylamine compound, a pyran compound, a quinacridone compound, a pyrrole compound, a phthalocyanine compound, a merocyanine compound, or a condensed aromatic carbocyclic compound.

Fluoranthene derivatives are compounds having a fluoranthene skeleton in their chemical structural formulae. Fluoranthene derivatives also include compounds having a condensed ring added to a fluoranthene skeleton. Thus, fluoranthene derivatives refer to compounds having a fluoranthene skeleton found in their chemical structural formulae. The same is true for naphthalene derivatives, anthracene derivatives, phenanthrene derivatives, tetracene derivatives, pyrene derivatives, and perylene derivatives.

The first organic compound preferably has an absorption wavelength in the visible range of 450 nm or more and 700 nm or less. In order for the photoelectric conversion layer to have the panchromatic absorption band, the absorption peak wavelength is particularly preferably in the range of 500 nm or more and 650 nm or less. Having the absorption peak wavelength in this range indicates absorption in a proximity range, such as a blue range of 450 nm or more and 470 nm or less or a red range of 600 nm or more and 630 nm or less, thus improving panchromaticity.

The first organic compound in the photoelectric conversion layer preferably constitutes less than 35% by weight, more preferably 27.5% or less by weight, of the first organic compound and the second organic compound. The first organic compound in this preferred range can further reduce dark current.

The following are specific examples of the first organic compound.

(1)

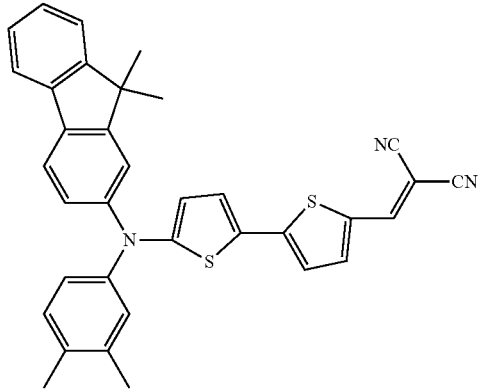

1-1

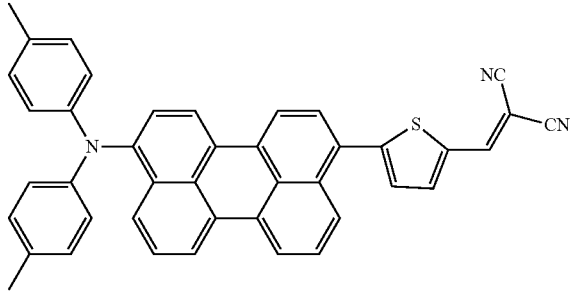

1-2

1-3
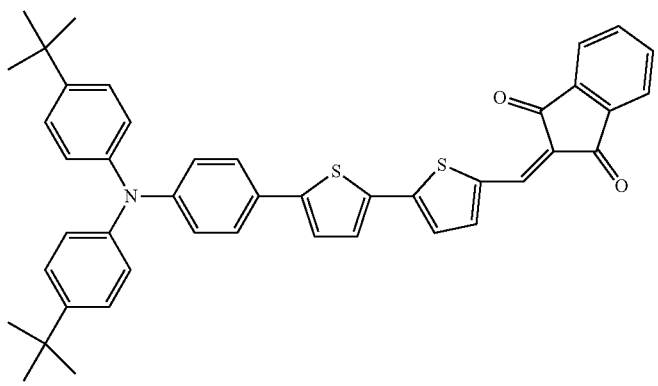
1-4
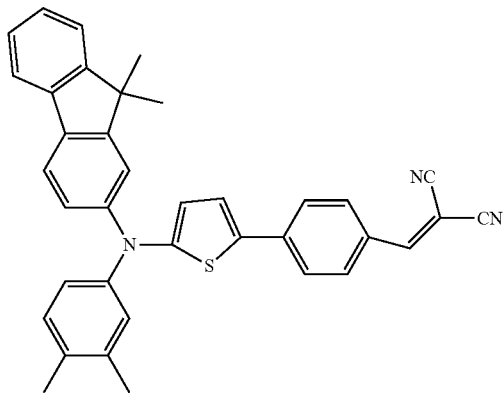
1-5
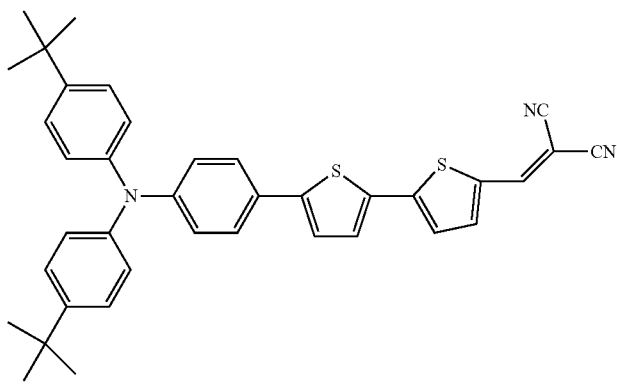
1-6  1-7
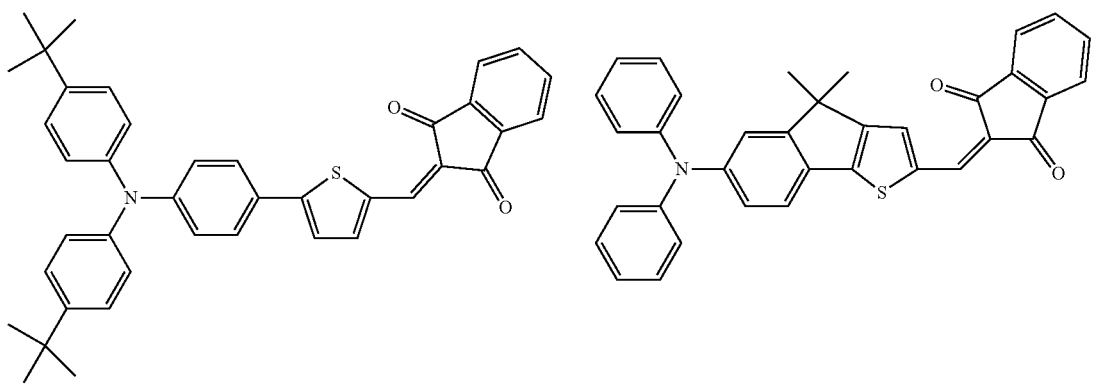

-continued
1-8
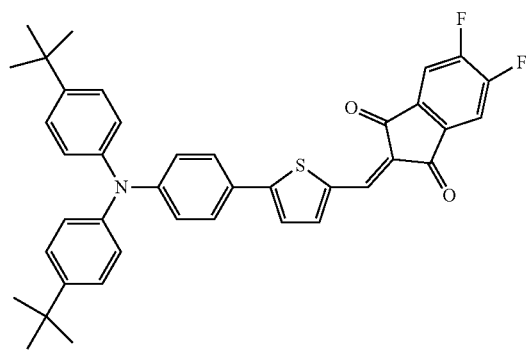
1-9
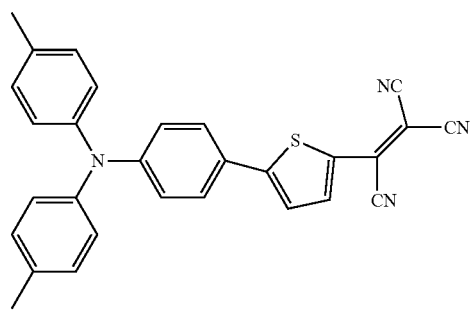
1-10
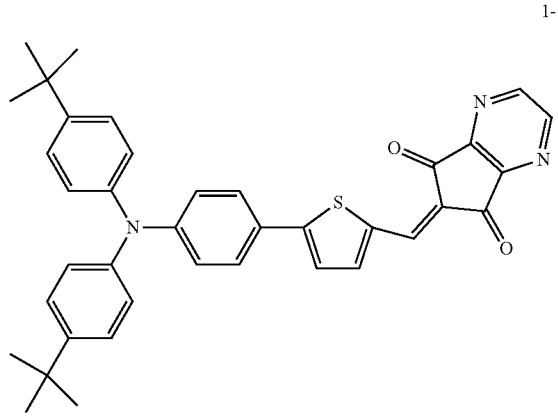
1-11
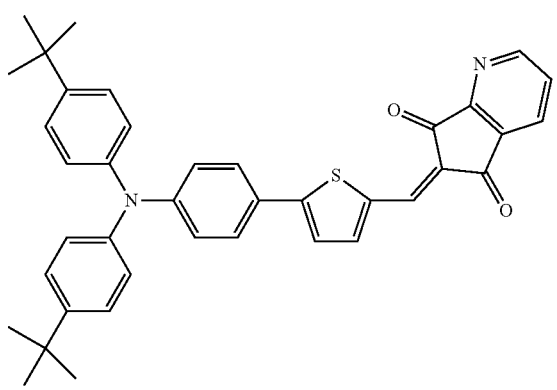
1-12
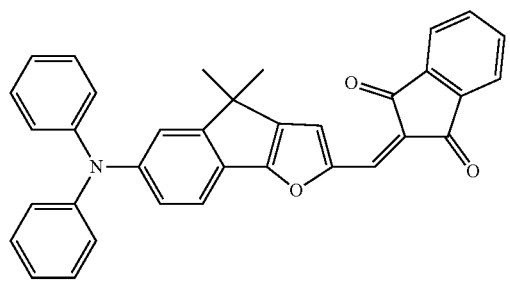
1-13
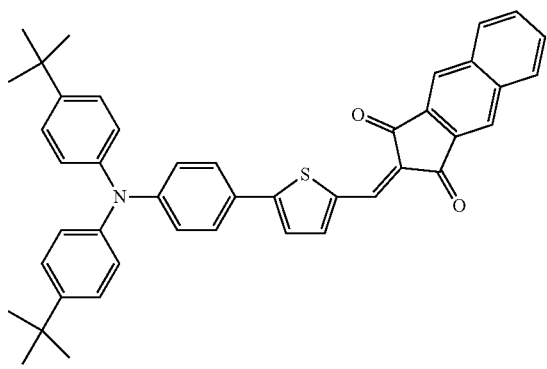
1-14
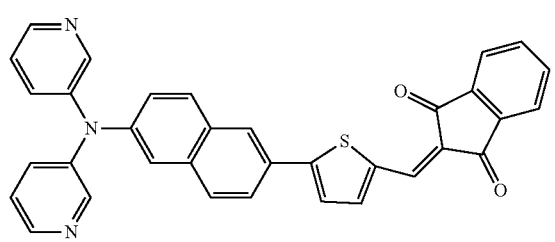
1-15
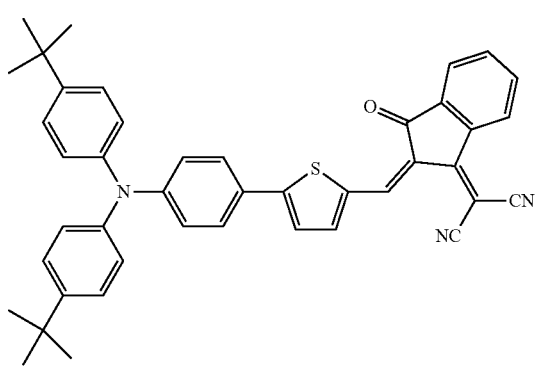

-continued
1-16
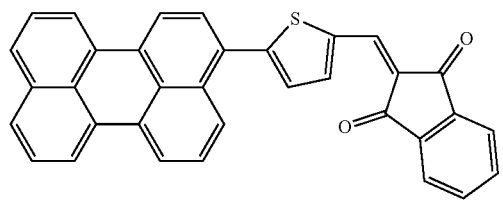
1-17
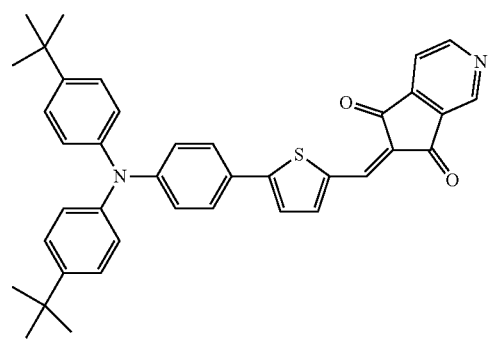
1-18
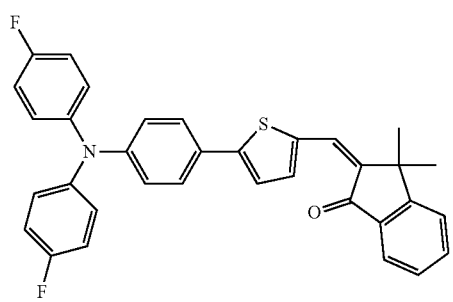
1-19
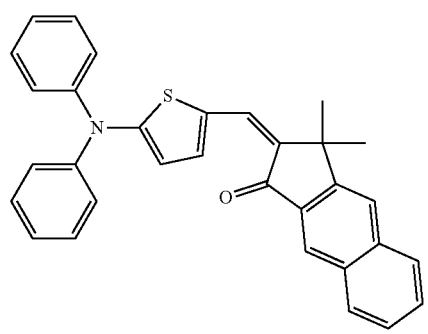
1-20
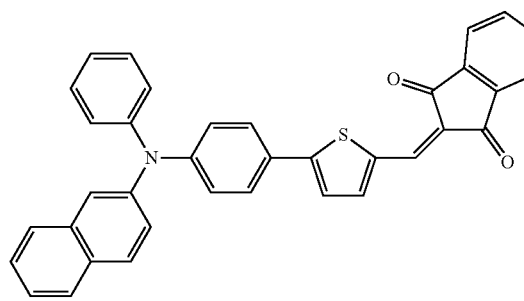
1-21
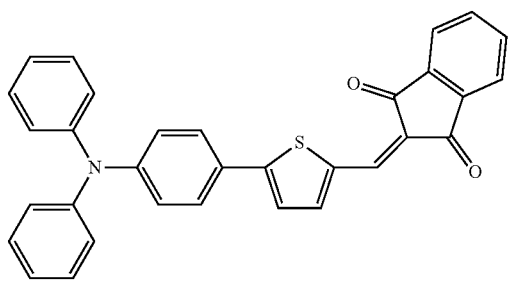
1-22
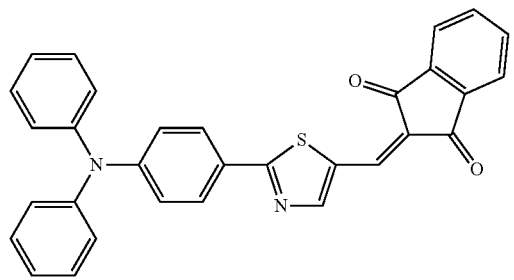
1-23
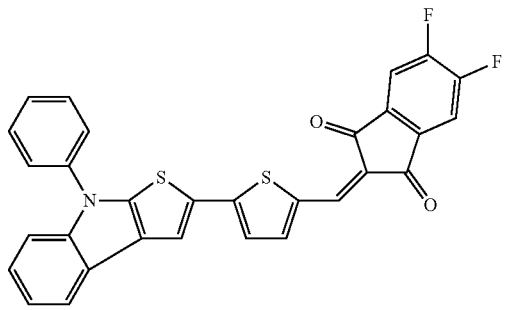

1-24
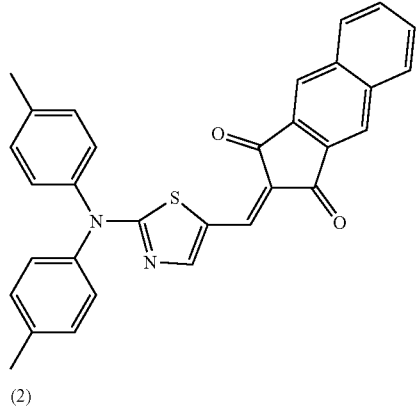
(2)
2-1
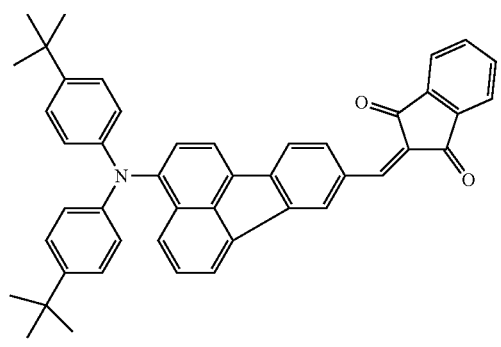
2-2
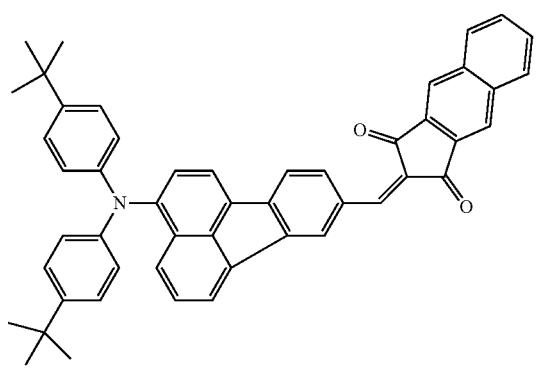
2-3
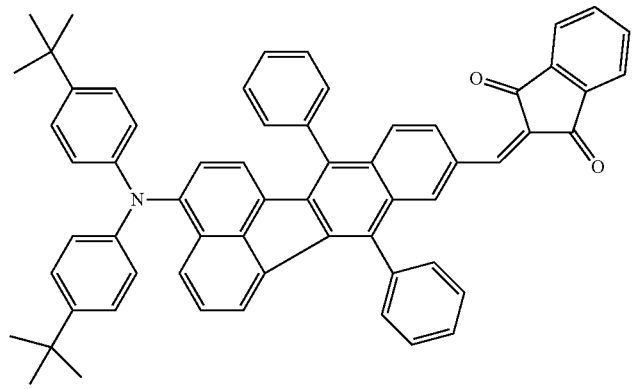
2-4
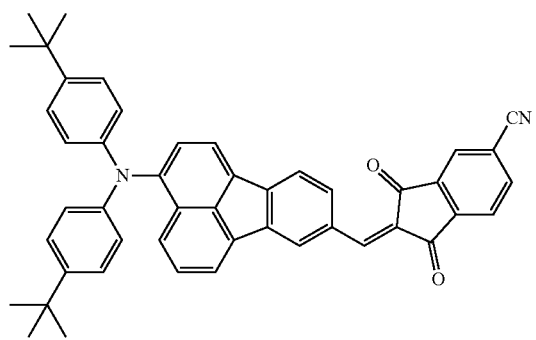
2-5
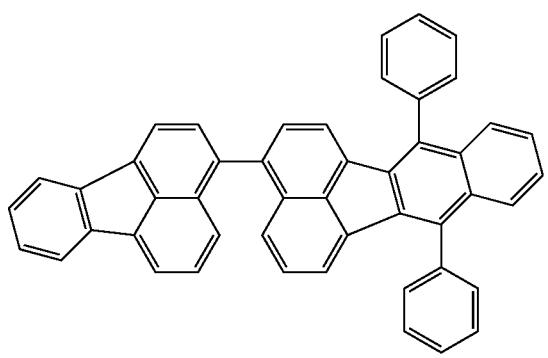

-continued
2-6
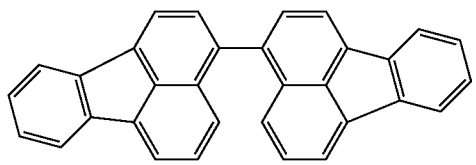
2-7
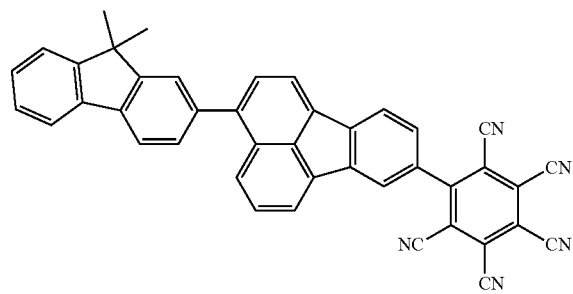
2-8
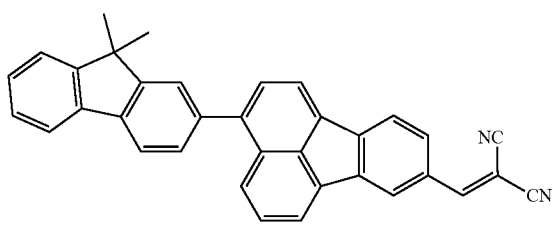
2-9
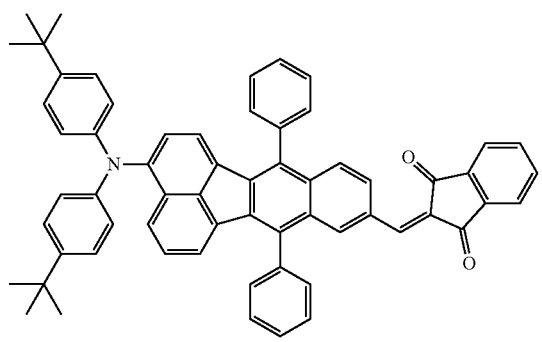
2-10
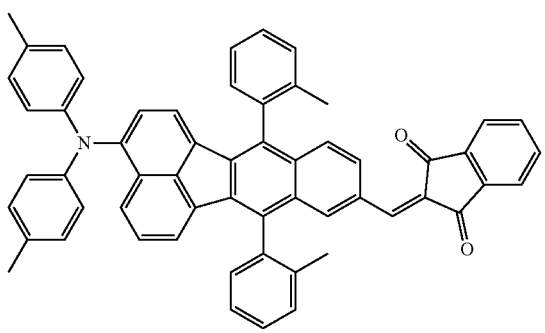
2-11
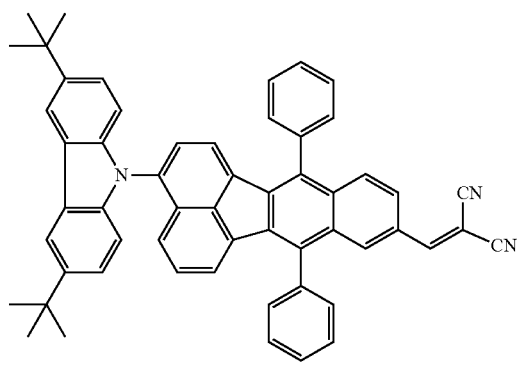
2-12
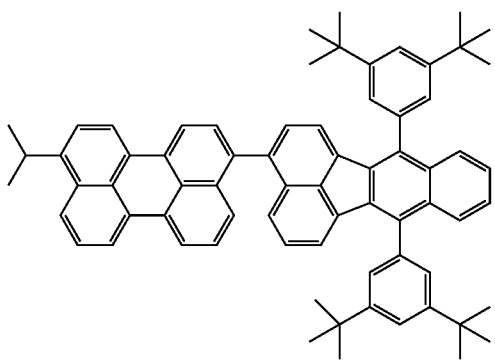
2-13
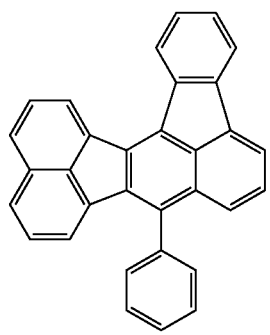

-continued
2-14
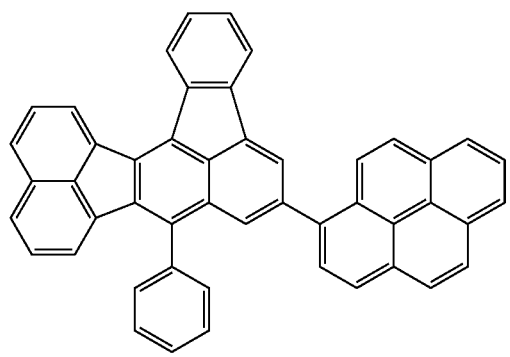
2-15
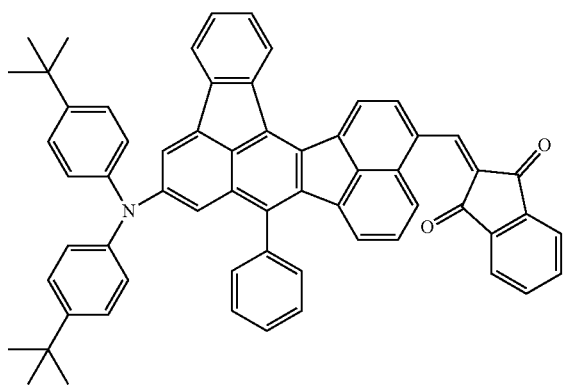
2-16
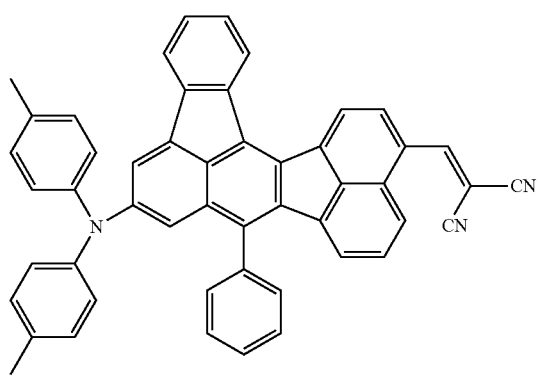
2-17
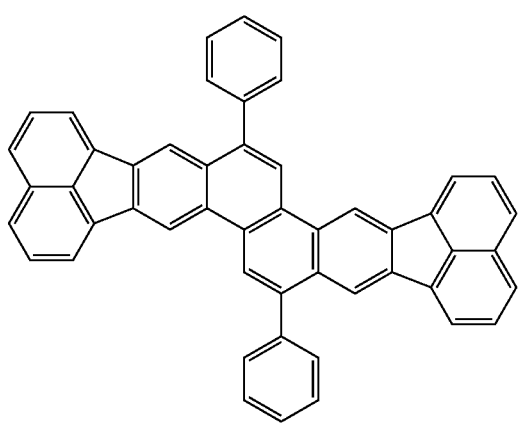
2-18
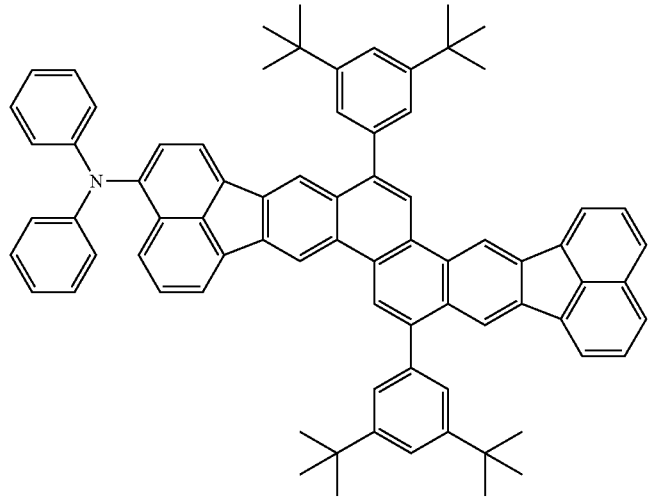

2-19
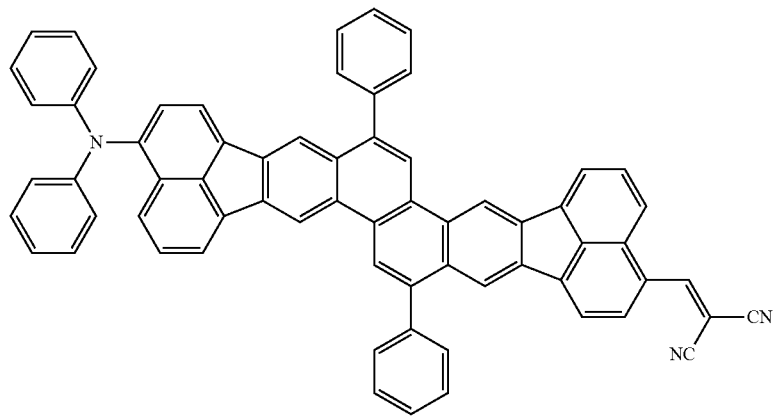
2-20
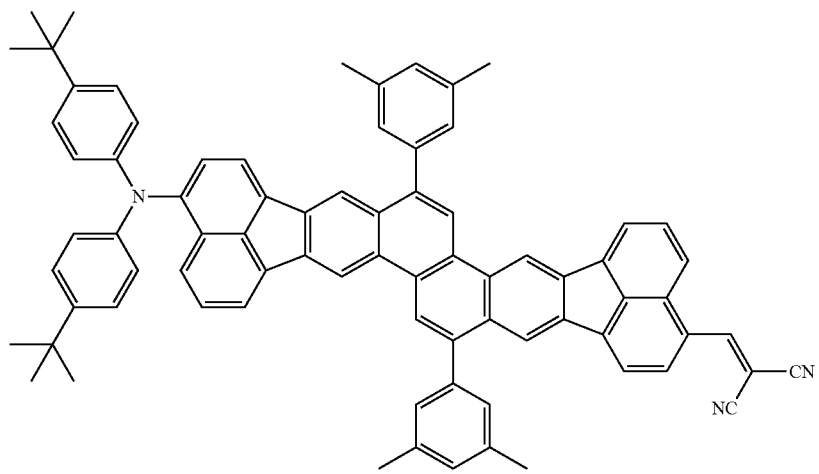
2-21
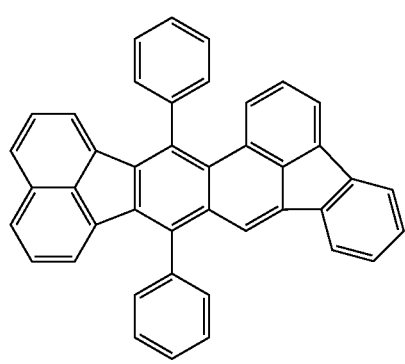
2-22
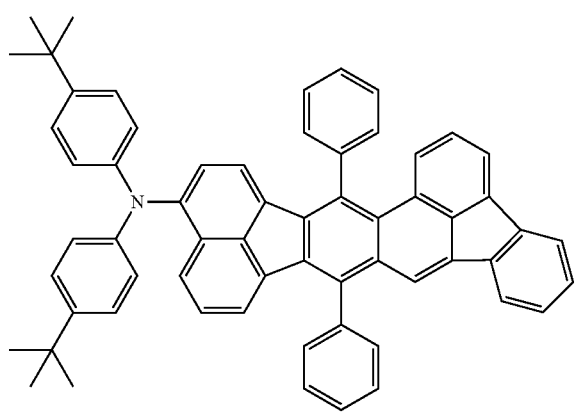

-continued
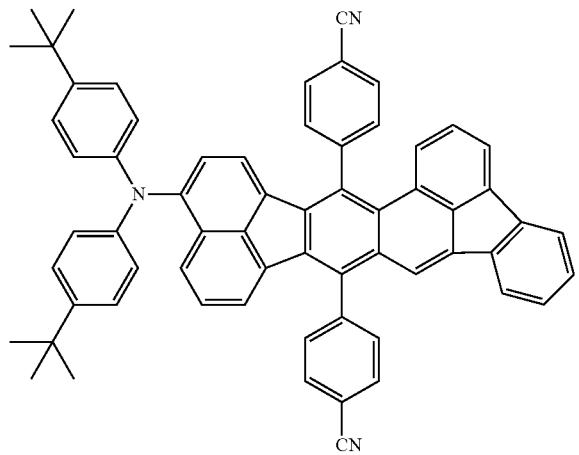
2-23
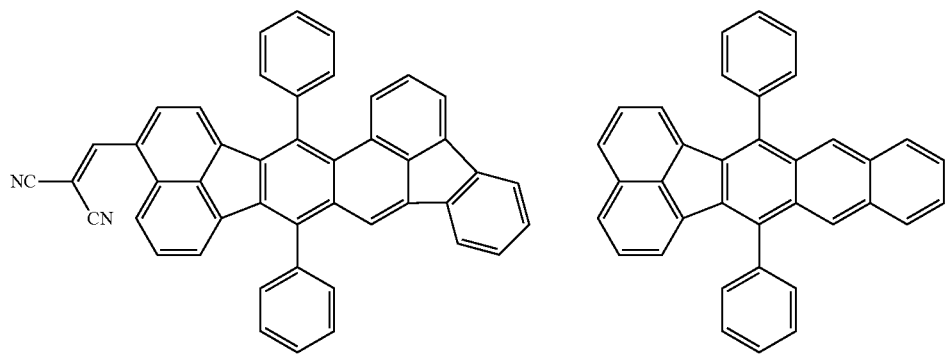
2-24
2-25
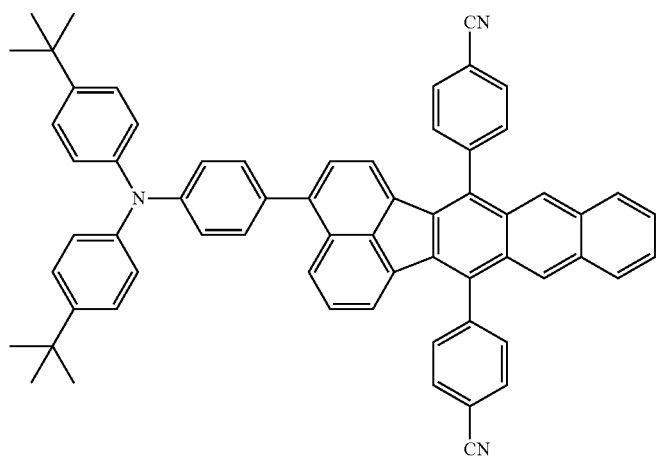
2-26
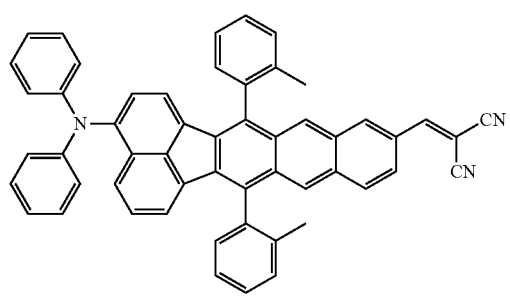
2-27
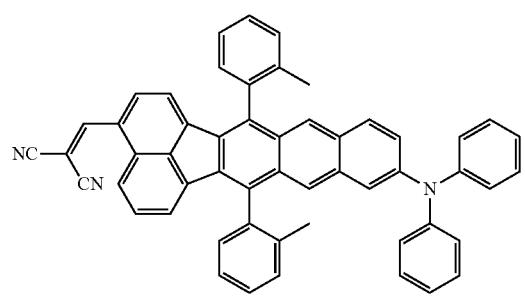
2-28

-continued
(3)
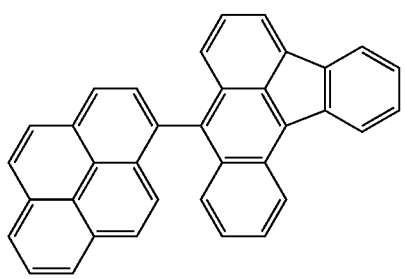
2-29
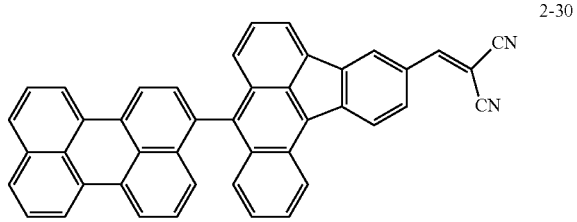
2-30
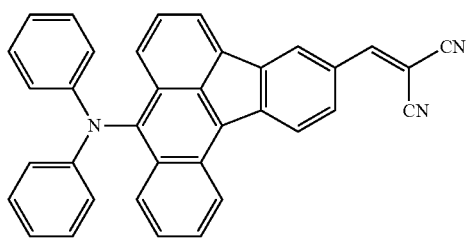
2-31
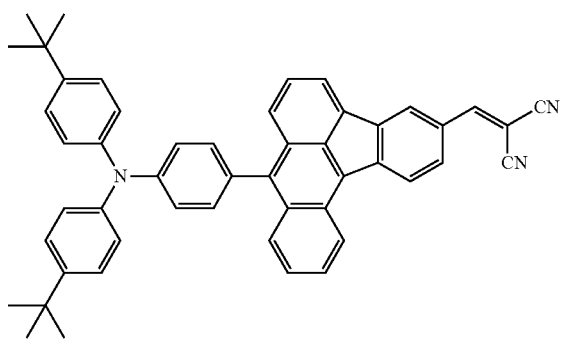
2-32
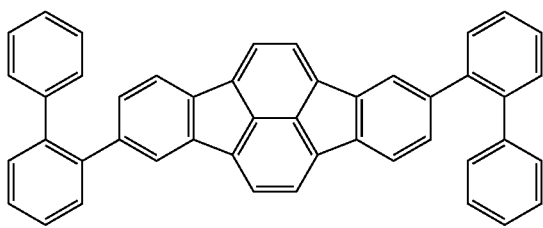
2-33
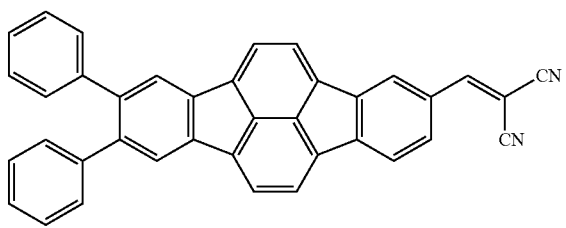
2-34
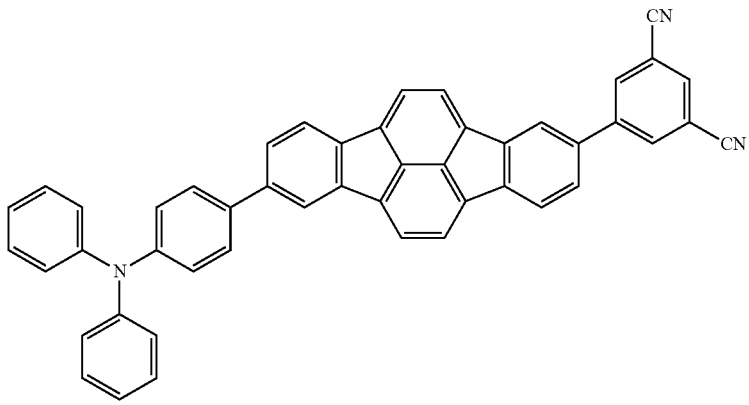
2-35

2-36
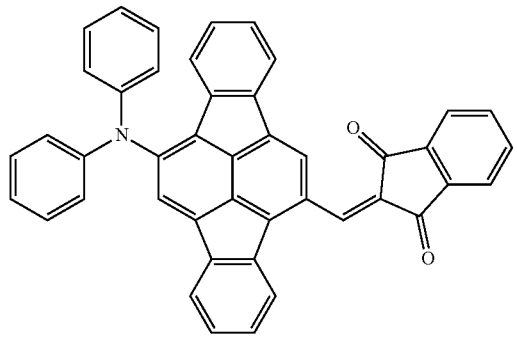
2-37
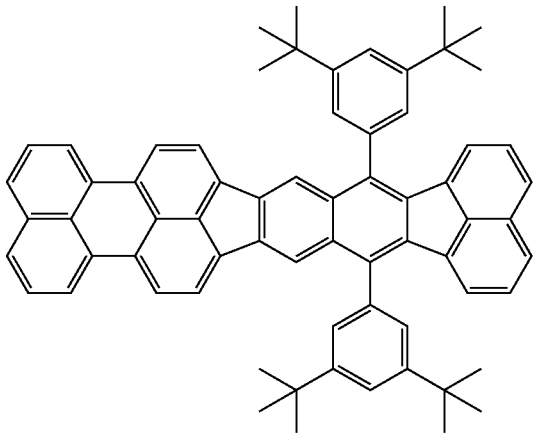
2-38
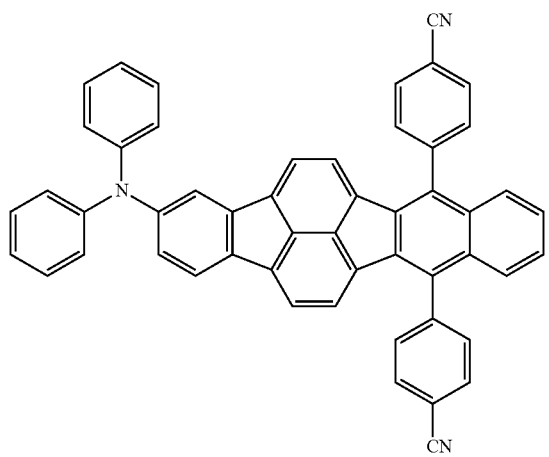
2-39
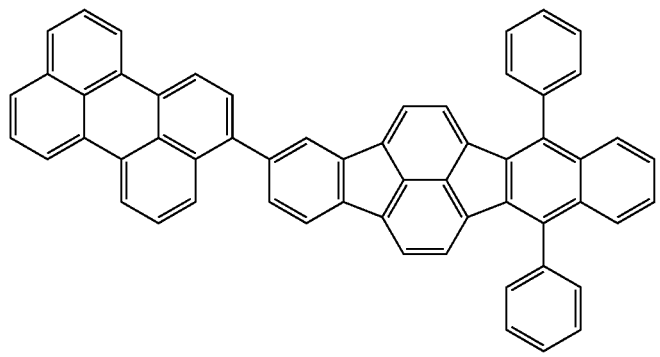
2-40
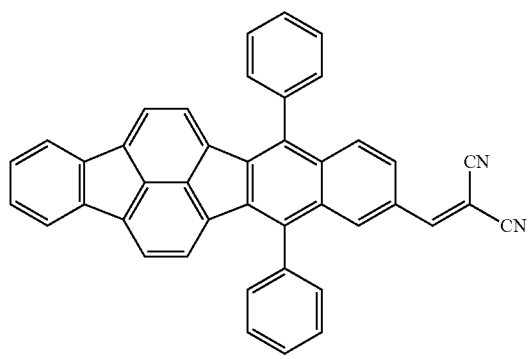
2-41
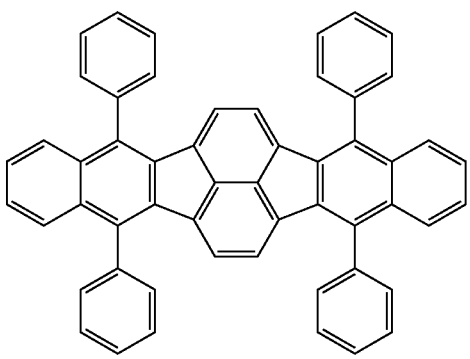

2-42
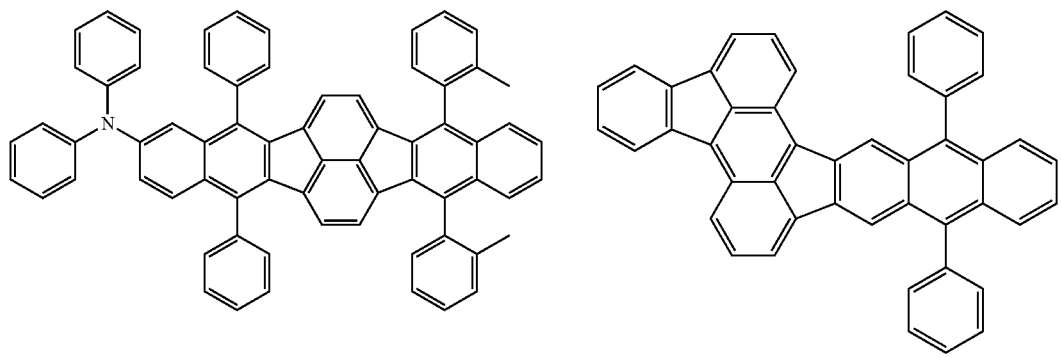
2-43
2-44
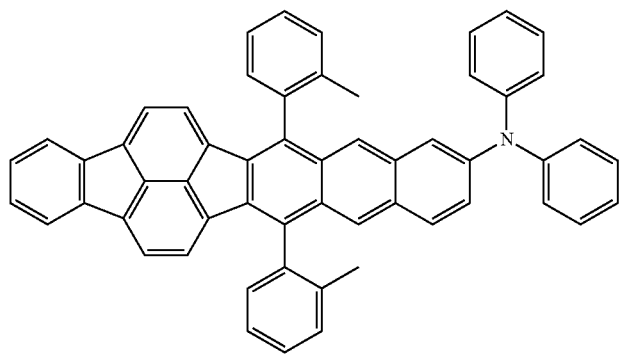
2-45
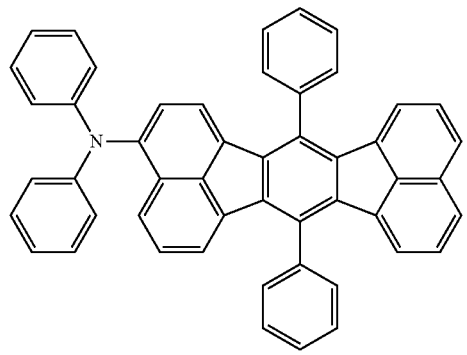
2-46
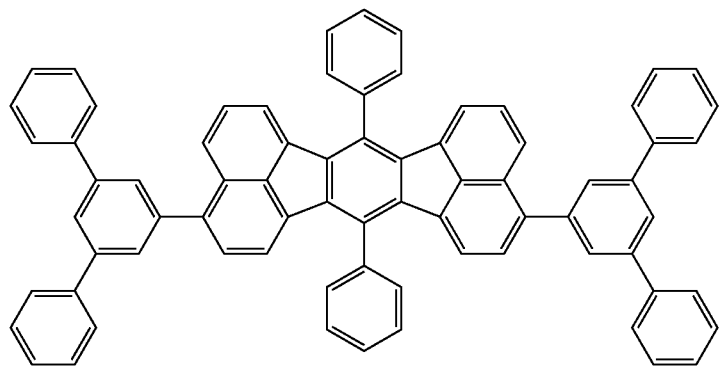

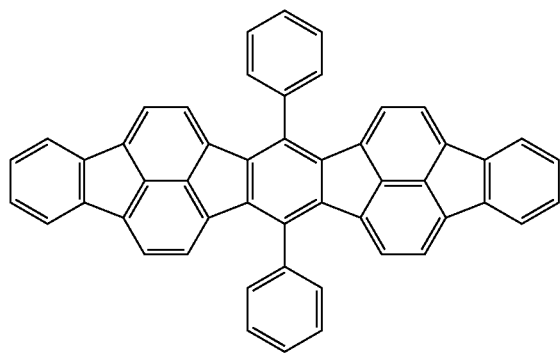
2-47
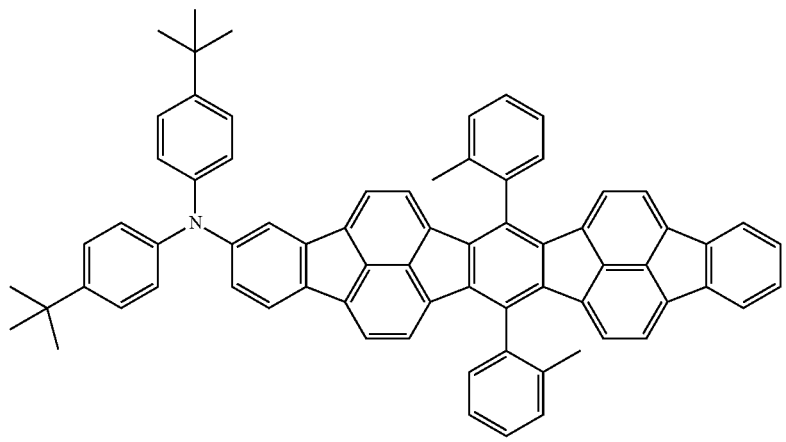
2-48
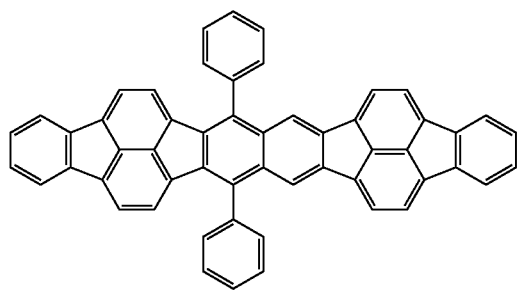
2-49
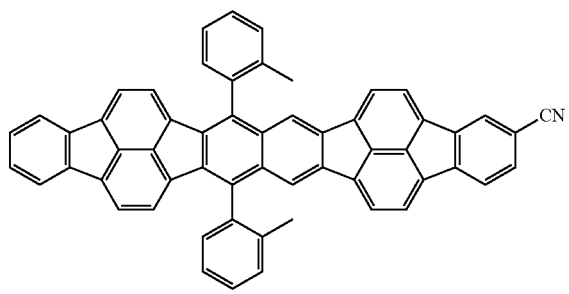
2-50
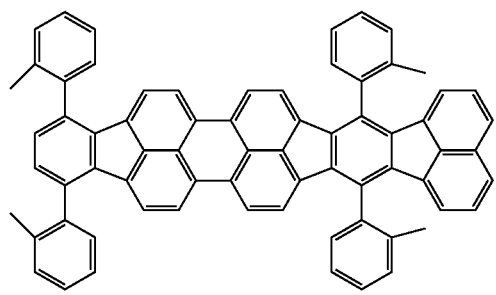
2-51
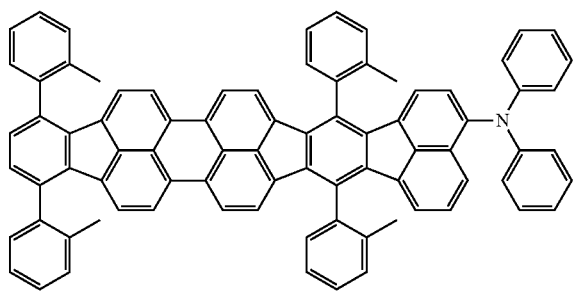
2-52

-continued
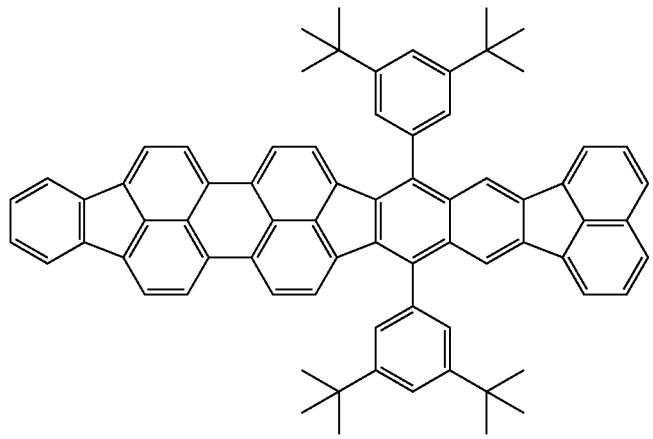
2-53
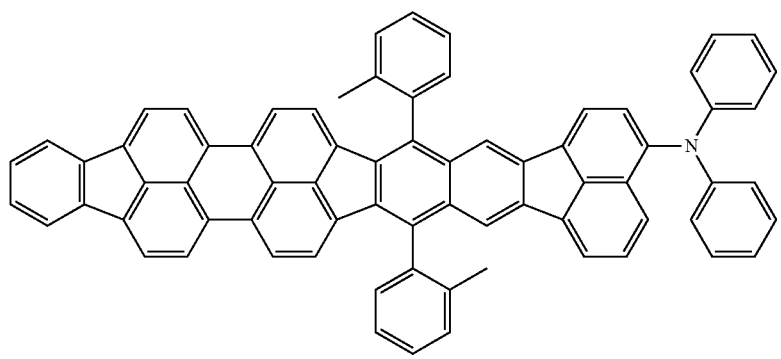
2-54
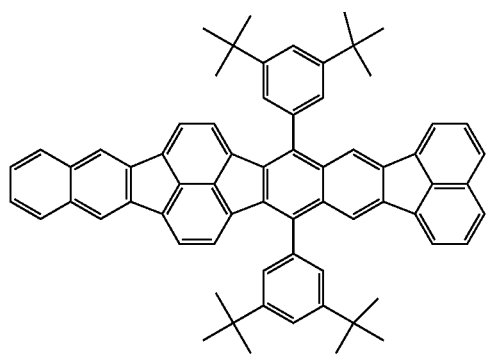
2-55
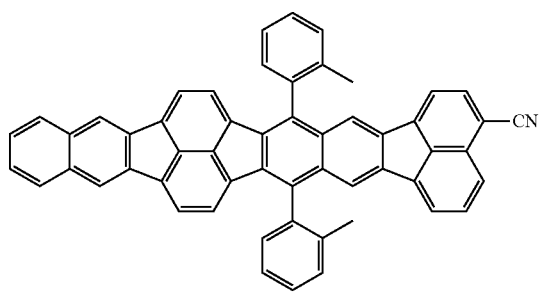
2-56

-continued
(4)
3-1
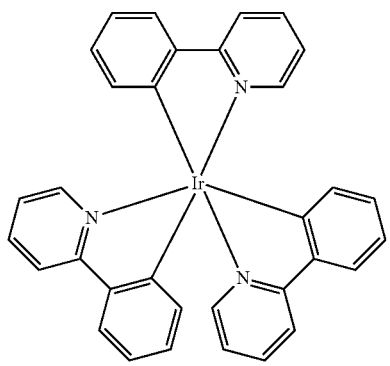
3-2
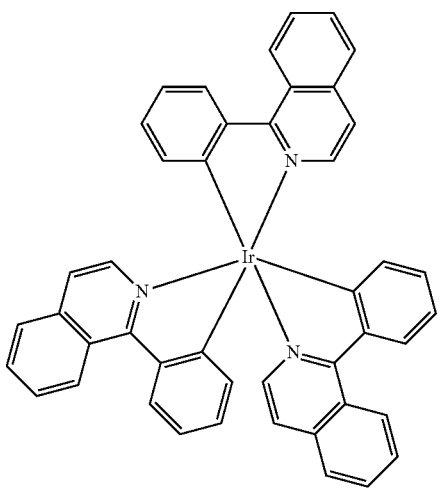
3-3
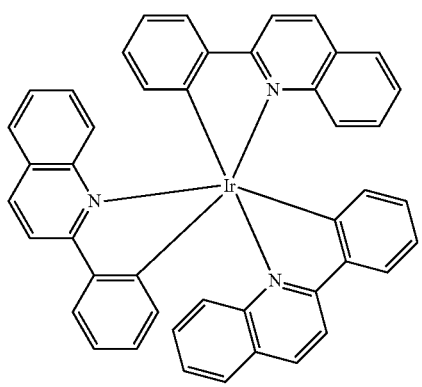
3-4
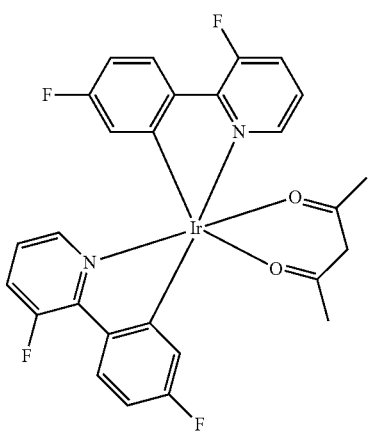
3-5
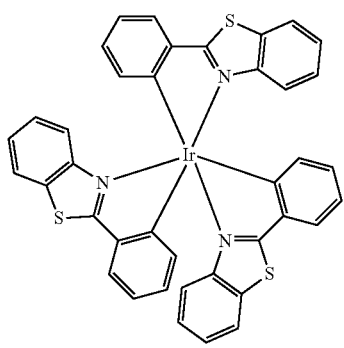
3-6
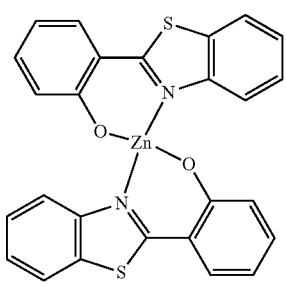
3-7
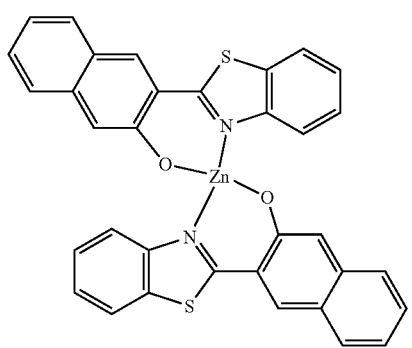
3-8
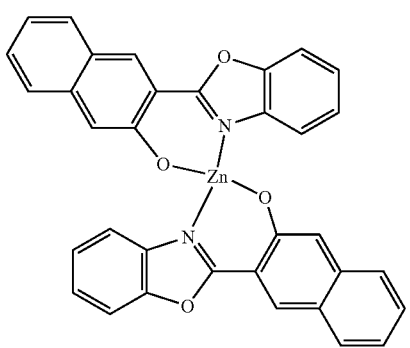

-continued 3-9
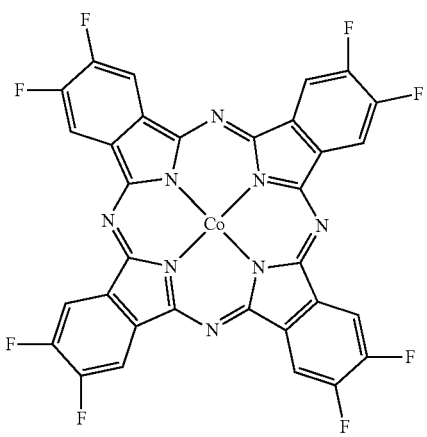

3-10
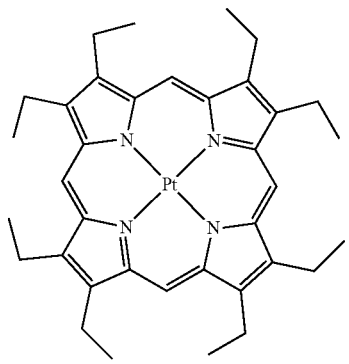

3-11
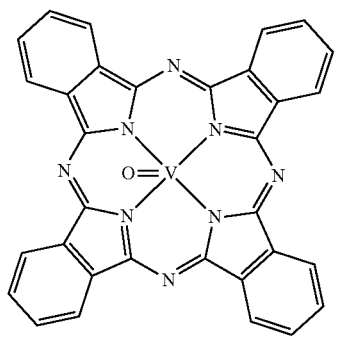

3-12
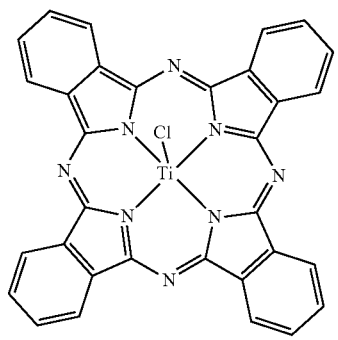

3-13
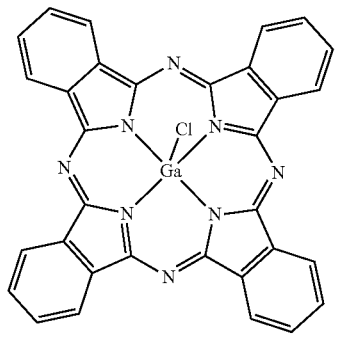

3-14
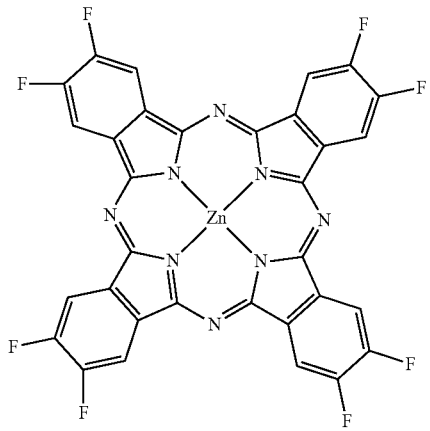

The exemplified compounds 1-1 to 1-24 have a 5-membered heterocyclic group with a sulfur atom in their centers. The electron-withdrawing substituent reduces thermoelectron generation, which causes dark current. Thus, each of the exemplified compounds 1-1 to 1-24 can be used as the first organic compound.

The exemplified compounds 1-1 to 1-24 have a 5-membered heterocyclic group with a sulfur atom and an aromatic group bonded to the 5-membered heterocyclic group. The aromatic group(s) forms a dihedral angle with the heterocyclic group and increases the excluded volume. An increased excluded volume makes it difficult for the acceptor material to approach the heterocyclic group and thereby retards electron transfer due to thermal excitation. This can reduce dark current.

The exemplified compounds 2-1 to 2-56 have a fluoranthene skeleton in their centers. Due to its electron-withdrawing properties, the fluoranthene skeleton reduces thermoelectron generation, which causes dark current. Thus, each of the exemplified compounds 2-1 to 2-56 can be used as the first organic compound.

The exemplified compounds 3-1 to 3-14 are complex compounds with a central metal atom. Each ligand contains a heterocyclic compound as an electron-withdrawing moiety and reduces thermoelectron generation, which causes dark current. Thus, each of the exemplified compounds 3-1 to 3-14 can be used as the first organic compound.

The photoelectric conversion layer may contain a fullerene or a fullerene derivative as the second organic compound. The fullerene or fullerene derivative may function as an n-type organic semiconductor.

Molecules of the fullerene or fullerene derivative in a first organic compound layer are linked to form an electron transport path. This improves electron-transport ability and improves the high-speed responsivity of the photoelectric conversion element.

The fullerene or fullerene derivative content is preferably in the range of 40% or more and 85% or less by weight of the first organic compound and the second organic compound in consideration of photoelectric conversion characteristics.

Examples of the fullerene or fullerene derivative include fullerene C60, fullerene C70, fullerene C76, fullerene C78, fullerene C80, fullerene C82, fullerene C84, fullerene C90, fullerene C96, fullerene C240, fullerene 540, mixed fullerene, and fullerene nanotubes.

Fullerene derivatives refer to fullerenes with a substituent. The substituent may be an alkyl group, an aryl group, or a heterocyclic group. The fullerene derivative can be fullerene C60.

The photoelectric conversion layer can be non-luminous. The term "non-luminous", as used herein, means that the emission quantum efficiency in the visible light region (wavelength: 400 to 730 nm) is 1% or less, preferably 0.5% or less, more preferably 0.1% or less. If the photoelectric conversion layer has an emission quantum efficiency of 1% or less, the photoelectric conversion layer even used in sensors and image pick-up elements has a small influence on the sensing performance or image pick-up performance and is therefore suitable for image pick-up elements.

The photoelectric conversion element according to the present embodiment may further include a hole-blocking layer between the anode and the photoelectric conversion layer. The hole-blocking layer controls the flow of holes from the anode to the photoelectric conversion layer and can have a high ionization potential.

The photoelectric conversion element according to the present embodiment may further include an electron-blocking layer between the cathode and the photoelectric conversion layer. The electron-blocking layer controls the flow of electrons from the cathode to the photoelectric conversion layer and can have low electron affinity or LUMO energy.

Figure 2:
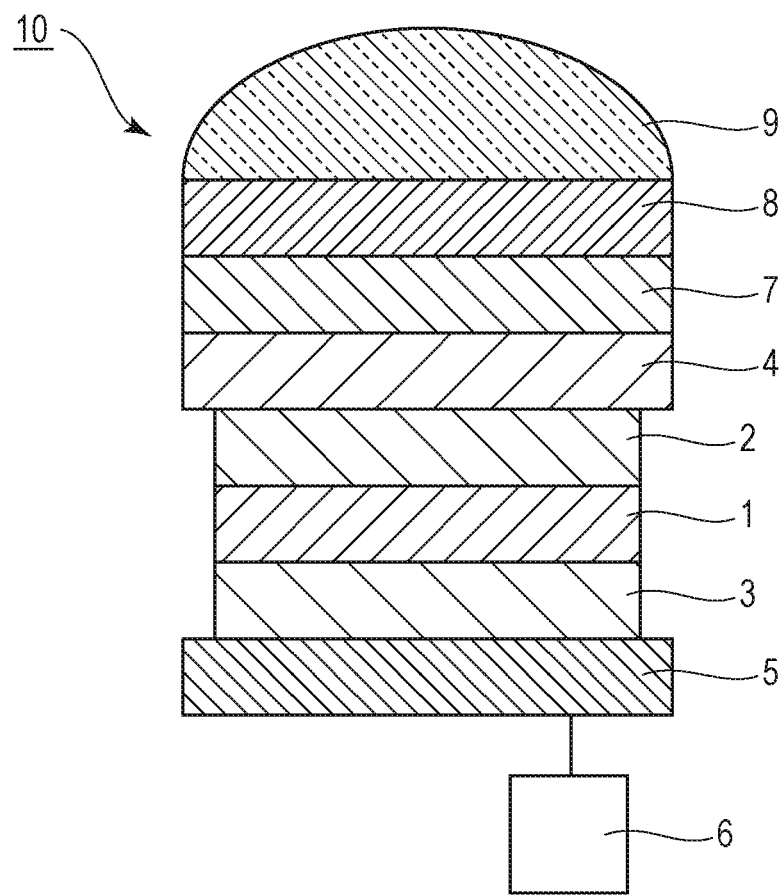
FIG. 2 is a cross-sectional frame format of a photoelectric conversion element according to an embodiment of the present disclosure.

FIG. 2 is a cross-sectional frame format of a photoelectric conversion element according to the present embodiment. The photoelectric conversion element includes a photoelectric conversion layer 1 between a pair of electrodes, an anode 4 and a cathode 5. The photoelectric conversion layer 1 converts light into electric charges. A protection layer 7, a wavelength selection layer 8, and a microlens 9 are disposed on the anode 4. The cathode 5 is coupled to a readout circuit 6.

One of the pair of electrodes closer to a substrate is also referred to as a lower electrode, and the other electrode far from the substrate is also referred to as an upper electrode. The lower electrode may be an anode or a cathode. The lower electrode may have high reflectivity. The electrode may be formed of a reflective material or may have an electrode layer and a reflective layer.

The photoelectric conversion element according to the present embodiment may include a substrate. The substrate may be a silicon substrate, a glass substrate, or a flexible substrate.

The cathode of the photoelectric conversion element according to the present embodiment collects holes from electric charges generated by the photoelectric conversion layer. On the other hand, the anode collects electrons from electric charges generated by the photoelectric conversion layer. The materials of the cathode and the anode may be any electrically conductive transparent materials. The materials of the cathode and the anode may be the same or different.

Specific examples of the materials of the electrodes include, but are not limited to, metals, metal oxides, metal nitrides, metal borides, electrically conductive organic compounds, and mixtures thereof. More specifically, examples of the materials of the electrodes include, but are not limited to, electrically conductive metal oxides, such as stannic oxides doped with antimony or fluorine (antimony-doped tin oxide (ATO), fluorine-doped tin oxide (FTO), etc.), stannic oxide, zinc oxide, indium oxide, indium tin oxide (ITO), and indium zinc oxide (IZO), metals, such as gold, silver, chromium, nickel, titanium, tungsten, and aluminum, and electrically conductive compounds, such as oxides and nitrides of these metals (for example, titanium nitride (TiN)), mixtures and layered bodies of these metals and electrically conductive metal oxides, electrically conductive inorganic materials, such as copper iodide and copper sulfide, electrically conductive organic materials, such as polyaniline, polythiophene, and polypyrrole, and layered bodies of these and ITO or titanium nitride. In particular, examples of the materials of the electrodes include, but are not limited to, titanium nitride, molybdenum nitride, tantalum nitride, and tungsten nitride.

The hole- or electron-collecting electrode of the photoelectric conversion element according to the present embodiment collects either of electric charges generated by the photoelectric conversion layer. A lower collecting electrode may be a pixel electrode in an image pick-up element. Whether the pixel electrode is a cathode or an anode depends on the device constitution and underlying circuitry. For example, a substrate/anode/photoelectric conversion layer/cathode may be disposed on the substrate in this order, or a substrate/cathode/photoelectric conversion layer/anode may be disposed in this order.

A method for forming an electrode can be appropriately selected in consideration of suitability for the electrode material. More specifically, an electrode can be formed by a wet method, such as a printing method or a coating method, a physical method, such as a vacuum evaporation method, a sputtering method, or an ion plating method, or a chemical method, such as a chemical vapor deposition (CVD) method or a plasma CVD method.

An ITO electrode may be formed by an electron beam method, a sputtering method, a resistance-heating evaporation method, a chemical reaction method (such as a sol-gel method), or indium tin oxide dispersion coating. ITO thus formed may be subjected to UV-ozone treatment or plasma treatment. A TiN electrode may be formed by a reactive sputtering method and may be subjected to annealing treatment, UV-ozone treatment, or plasma treatment.

The photoelectric conversion element may further include a sealing layer. The sealing layer may be formed of any material, such as an inorganic material. More specifically, the sealing layer may be formed of silicon oxide, silicon nitride, silicon oxynitride, or aluminum oxide. Silicon oxide, silicon nitride, or silicon oxynitride may be deposited by a sputtering method or a CVD method. Aluminum oxide may be deposited by an atomic layer deposition (ALD) method.

The sealing layer has a water permeability of $10^{-5}$ g/m$^2$/day or less as sealing performance. The sealing layer may have any thickness and preferably has a thickness of 0.5 μm or more in terms of sealing performance. The sealing layer preferably has a minimum thickness as long as the sealing layer can maintain the sealing performance, particularly preferably a thickness of 1 μm or less.

The reason for the minimum thickness of the sealing layer is that color mixing in an image pick-up element can be effectively reduced when the distance from the photoelectric conversion layer to a color filter is decreased.

The production of the photoelectric conversion element may include an annealing step. The annealing temperature may be, but is not limited to, in the range of 150° C. or more and 190° C. or less. The annealing temperature depends on the annealing time.

[Image Pick-Up Element According to Embodiment]

An image pick-up element according to an embodiment of the present disclosure has a plurality of pixels. The pixels include a photoelectric conversion element according to an embodiment of the present disclosure and a readout transistor coupled to the photoelectric conversion element.

The pixels may be arranged in a matrix of rows and columns. Each of the pixels may be coupled to a signal-processing circuit. The signal-processing circuit receives a signal from each pixel and can produce an image.

The readout transistor transfers a signal based on an electric charge generated by the photoelectric conversion element.

The signal-processing circuit may be a complementary metal-oxide semiconductor (CMOS) sensor or a charge-coupled device (CCD) sensor.

The image pick-up element may include a light filter, for example, a color filter. If the photoelectric conversion element responds to light of a particular wavelength, the image pick-up element may include a color filter for the photoelectric conversion element. One light-receiving pixel may be provided with one color filter, or a plurality of light-receiving pixels may be provided with one color filter.

In addition to the color filter, the light filter may be a low-pass filter, which transmits light of a wavelength longer than the infrared wavelengths, or a UV-cutoff filter, which transmits light of a wavelength shorter than the ultraviolet wavelengths.

The image pick-up element may include an optical member, such as a microlens. The microlens focuses external light on the photoelectric conversion layer. One light-receiving pixel may be provided with one microlens, or a plurality of light-receiving pixels may be provided with one microlens. In the case of a plurality of light-receiving pixels, each of the light-receiving pixels may be provided with one microlens.

The image pick-up element according to the present embodiment may be used in an image pick-up apparatus. An image pick-up apparatus includes an imaging optical system, which includes a plurality of lenses, and an image pick-up element, which receives light passing through the imaging optical system. The image pick-up apparatus includes the image pick-up element and a housing of the image pick-up element. The housing may have a joint for the imaging optical system. More specifically, the image pick-up apparatus is a digital camera or a digital still camera.

The image pick-up apparatus may further include a receiver to receive external signals. The signals received by the receiver control at least one of an image pick-up region, a start of image pick-up, and an end of image pick-up of the image pick-up apparatus. The image pick-up apparatus may further include a transmitter to transmit an image thus acquired to the outside. The acquired image may be a captured image or an image transmitted from another equipment.

The image pick-up apparatus with a receiver and a transmitter may be used as a network camera.

Figure 3:
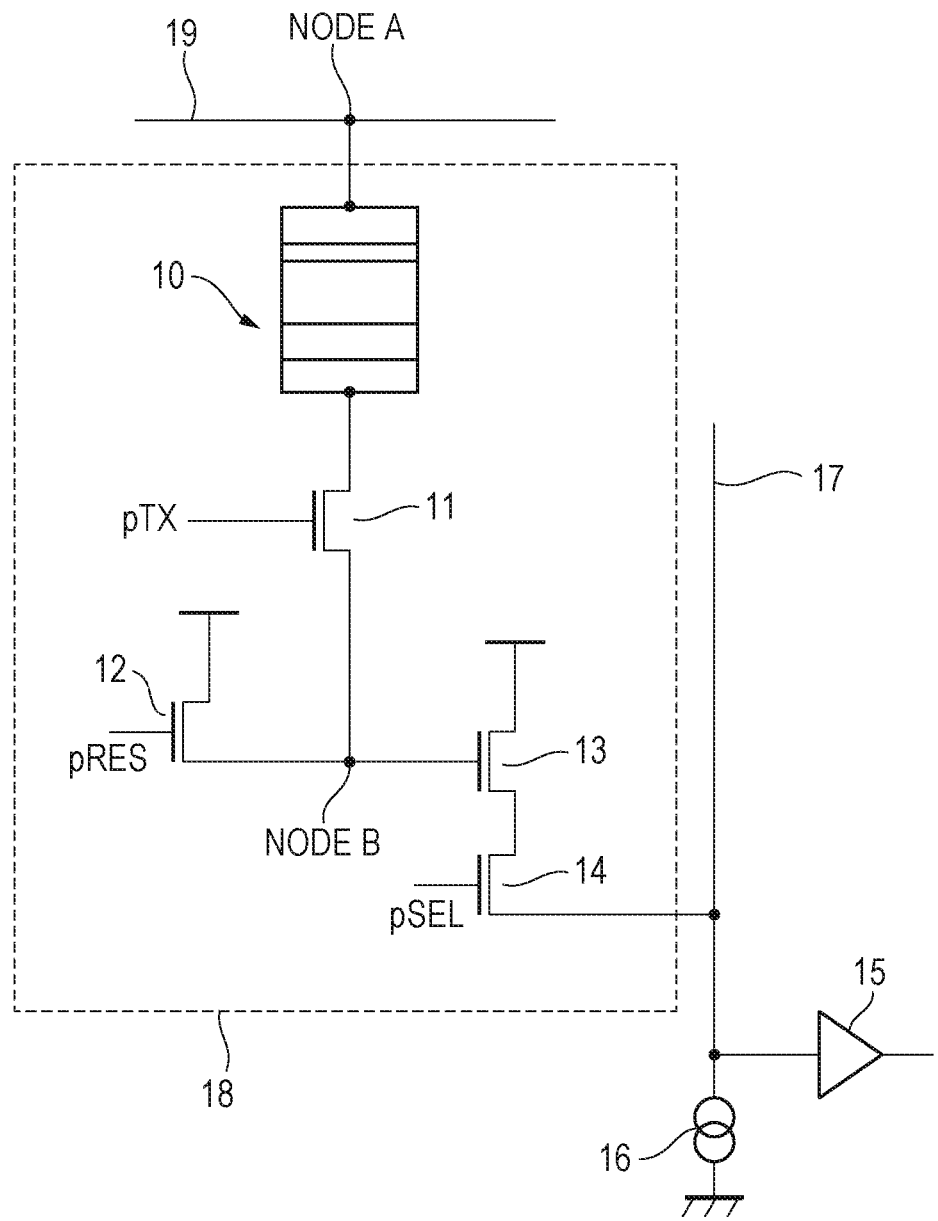
FIG. 3 is a circuit diagram in which a pixel including a photoelectric conversion element according to an embodiment of the present disclosure is driven.

FIG. 3 is a circuit diagram of a pixel including a photoelectric conversion apparatus according to an embodiment of the present disclosure. A photoelectric conversion apparatus 10 is connected to a common line 19 at the node A. The common line 19 may be grounded.

A pixel 18 may include the photoelectric conversion element 10 and a readout circuit for reading signals produced by the photoelectric conversion layer. The readout circuit may include a transfer transistor 11 electrically connected to the photoelectric conversion element 10, an amplifying transistor 13 including a gate electrode electrically connected to the photoelectric conversion element 10, a selection transistor 14 for selecting a pixel from which information is read, and a reset transistor 12 for supplying a resetting voltage to the photoelectric conversion element 10.

Transfer in the transfer transistor 11 may be controlled by pTX. Voltage supply in the reset transistor 12 may be controlled by pRES. The selected or unselected state of the selection transistor 14 may be determined by pSEL.

The transfer transistor 11, the reset transistor 12, and the amplifying transistor 13 are connected together at the node B. The transfer transistor 11 may be omitted.

The reset transistor 12 supplies a voltage to reset the electric potential at the node B. pRES is applied to the gate of the reset transistor 12 to control voltage supply. The reset transistor 12 may be omitted.

The amplifying transistor 13 generates an electric current depending on the electric potential of the node B. The amplifying transistor 13 is coupled to the selection transistor 14 for selecting a pixel from which a signal is output. The selection transistor 14 is coupled to a current source 16 and a column output unit 15. The column output unit 15 may be coupled to a signal-processing unit.

The selection transistor 14 is coupled to a vertical output signal line 17. The vertical output signal line 17 is coupled to the current source 16 and the column output unit 15.

Figure 4:
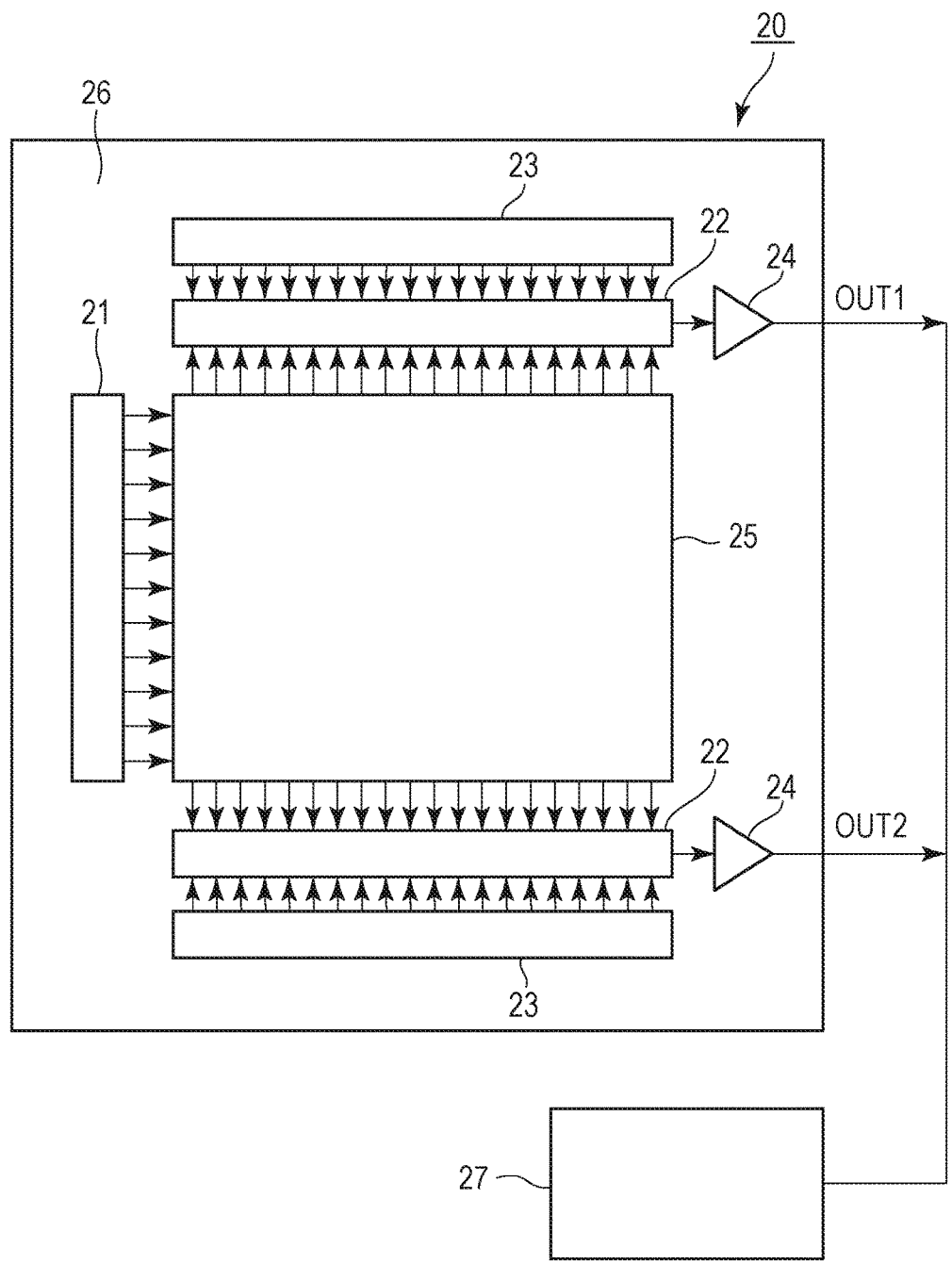
FIG. 4 is a peripheral circuit frame format of an image pick-up element including a photoelectric conversion element according to an embodiment of the present disclosure.

FIG. 4 illustrates an image pick-up element according to an embodiment of the present disclosure. An image pick-up element 20 includes an image pick-up region 25 and a peripheral region 26. The image pick-up region 25 includes a two-dimensional array of pixels. The region outside the image pick-up region 25 is the peripheral region 26. The peripheral region 26 includes a vertical scanning circuit 21, a readout circuit 22, a horizontal scanning circuit 23, and an output amplifier 24. The output amplifier 24 is coupled to a signal-processing unit 27. The signal-processing unit 27 performs signal processing according to the information read by the readout circuit 22. The signal-processing unit 27 may be a CCD circuit or a CMOS circuit.

The readout circuit 22 includes a column amplifier, a correlated double sampling (CDS) circuit, and an adder circuit, for example. The readout circuit 22 performs amplification or addition of signals read from the pixels in the row selected by the vertical scanning circuit 21 via a vertical signal line. The column amplifier, CDS circuit, and adder circuit are disposed for each pixel column or for every set of multiple pixel columns, for example. The horizontal scanning circuit 23 produces a signal for sequentially reading a signal from the readout circuit 22. The output amplifier 24 amplifies a signal from the column selected by the horizontal scanning circuit 23 and outputs the signal.

These embodiments are only examples of a photoelectric conversion apparatus according to the present disclosure. The present disclosure is not limited to these embodiments. The readout circuit 22, the horizontal scanning circuit 23, and the output amplifier 24 are disposed above and below the image pick-up region 25 to constitute two output paths. The number of output paths may be three or more. Signals from the output amplifiers 24 are synthesized as an image signal in the signal-processing unit 27.

EXAMPLES

[Measurement of Oxidation Potential of Material of First Organic Compound]

The electrochemical characteristics, such as oxidation potential, can be evaluated by cyclic voltammetry (CV).

Figure 5:
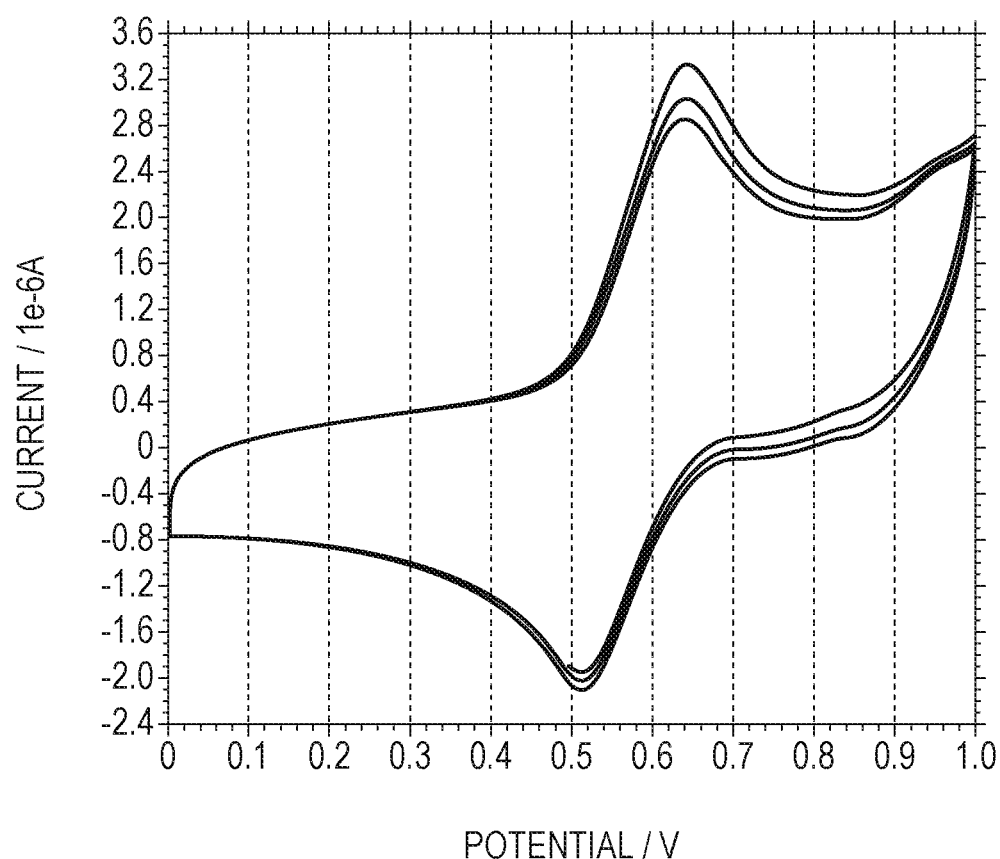
FIG. 5 is a cyclic voltammogram for determining the oxidation potential and reduction potential of an organic compound.

A CV measurement sample was prepared by dissolving approximately 1 mg of a first organic compound in 10 mL of an ortho-dichlorobenzene solution of 0.1 M tetrabutylammonium perchlorate followed by deaeration with nitrogen. The CV measurement was performed by a three-electrode method with a nonaqueous solvent Ag/Ag$^+$ reference electrode, a platinum counter electrode 0.5 mm in diameter and 5 cm in length, and a glassy carbon working electrode 3 mm in inner diameter (each manufactured by BAS Inc.). The electrochemical measuring apparatus was an electrochemical analyzer, model 660C, manufactured by ALS Co., Ltd. The scanning speed was 0.1 V/s. FIG. 5 is a cyclic voltammogram for determining the oxidation potential and reduction potential of a compound. The oxidation potential and reduction potential can be estimated from the peak values of the cyclic voltammogram. The oxidation potential is hereinafter referred to as Eox, and the reduction potential is hereinafter referred to as Ered.

Table 1 lists the oxidation potential of the exemplified compounds of the first organic compounds. Table 1 lists the exemplified compound numbers of the first organic compounds.

TABLE 1

| First organic compound | Eox [V] |
|---|---|
| 1-1 | 0.58 |
| 1-3 | 0.59 |
| 1-5 | 0.63 |
| 1-6 | 0.67 |
| 1-7 | 0.67 |
| 1-8 | 0.67 |
| 1-9 | 1.12 |
| 1-13 | 0.69 |
| 1-16 | 0.73 |
| 1-21 | 0.75 |
| 1-22 | 0.84 |
| 1-23 | 0.96 |
| 1-24 | 1.03 |
| 2-1 | 0.70 |
| 2-2 | 0.71 |
| 2-14 | 1.09 |
| 3-1 | 0.54 |
| 3-2 | 0.67 |
| 3-4 | 0.90 |
| 2-37 | 0.66 |
| 2-43 | 0.84 |

Exemplary Embodiment 1

In the present exemplary embodiment, a photoelectric conversion element was produced by using a combination of a first organic compound and a second organic compound satisfying $\Delta E \geq 1.79$ V. Dark current was measured in the photoelectric conversion element.

In the present exemplary embodiment, the photoelectric conversion element was formed on a Si substrate. The photoelectric conversion element included a cathode, an electron-blocking layer, a photoelectric conversion layer, a hole-blocking layer, and an anode in this order.

In the present exemplary embodiment, the photoelectric conversion element was produced by the following process.

First, the Si substrate was prepared. A wiring layer and an insulating layer were stacked on the Si substrate. An electrically conductive contact hole was formed in the insulating layer on the wiring layer at a position corresponding to each pixel. The contact holes were connected together via a pad on the edge of the substrate and wiring. An IZO electrode was formed over the contact holes by a sputtering method. A 3-mm$^2$ IZO electrode (cathode) was formed by patterning. The IZO electrode had a thickness of 100 nm.

An organic compound layer was formed on the IZO electrode by a vacuum evaporation method. Table 2 shows the structure and thickness of the layers. IZO was then deposited as an anode by a sputtering method. The anode had a thickness of 30 nm.

Table 2 show the layer structure of the photoelectric conversion element.

TABLE 2

| | Materials | Thickness |
|---|---|---|
| Anode | IZO | 30 nm |
| Hole-blocking layer | d-2 (C60) | 20 nm |
| Photoelectric conversion layer | Exemplified compound 1-21:d-4 = 25:75 | 380 nm |
| Electron-blocking layer | d-1 | 80 nm |
| Cathode | IZO | 100 nm |

In Table 2, the lower electrode, the cathode, is located at the bottom.

The electron-blocking layer was formed of the following compound (d-1).

(5)

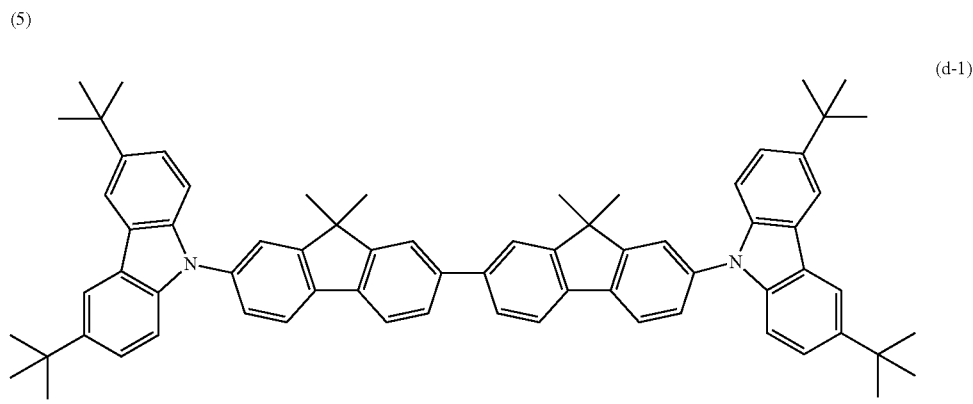

(d-1)

The first organic compounds of the photoelectric conversion layer were the exemplified compounds 1-1 to 3-14, and the hole-blocking layer was formed of fullerene C60 (d-2) or C70 (d-3) or the organic compound (d-4).

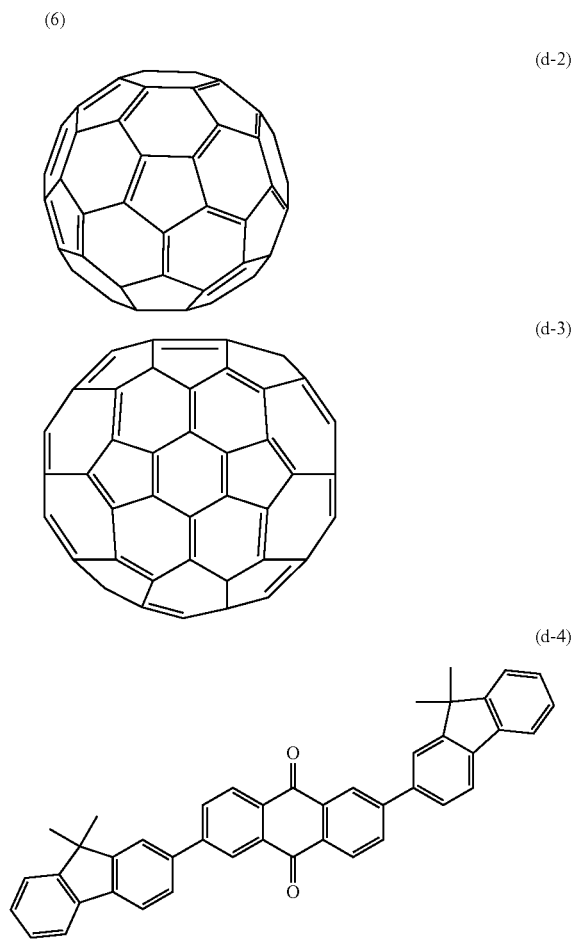

Table 3 lists the reduction potentials of d-2, d-3, and d-4.

TABLE 3

| Second organic compound | Ered (V) |
|---|---|
| d-2 | −0.83 |
| d-3 | −0.79 |
| d-4 | −1.04 |

After the formation of the upper electrode, a hollow seal was formed with a glass cap and a UV curable resin. The element thus produced was annealed on a hot plate at 170° C. for approximately 1 hour with the sealing surface facing upward.

The characteristics of the photoelectric conversion element were measured and evaluated. The electric current was measured at 5 V. The current value in a bright place was at least 10 times the current value in a dark place in all the elements. This proves that the photoelectric conversion elements function properly.

In the measurement of the dark current of the photoelectric conversion elements, a prober held in a thermostat at 60° C. and electrically connected to a semiconductor parameter analyzer (Agilent 4155C) was brought into contact with the electrode.

The dark current was rated as follows:
A: less than 100 pA/cm$^2$,
B: 100 pA/cm$^2$ or more and less than 1000 pA/cm$^2$, and
C: 1000 pA/cm$^2$ or more.

A is good, and B and C are poor.

The dark current ratings of the photoelectric conversion elements according to the exemplary embodiments were A. A 10-μm square pixel has an area of $1.0 \times 10^{-6}$ cm$^2$. Image pick-up elements including the photoelectric conversion elements can have low dark current. The low dark current characteristics result in an image pick-up element with low noise.

Exemplary Embodiments 2 to 15

Photoelectric conversion elements were produced in the same manner as in Exemplary Embodiment 1 except that the combinations of the first organic compound and the second organic compound listed in Table 4 were used. Table 4 lists the results for Exemplary Embodiments 1 to 15.

TABLE 4

| Exemplary embodiment | First organic compound | Second organic compound | ΔE | Rating |
|---|---|---|---|---|
| 1 | 1-21 | d-4 | 1.79 | A |
| 2 | 1-23 | d-2 | 1.79 | A |
| 3 | 1-24 | d-3 | 1.82 | A |
| 4 | 1-24 | d-2 | 1.86 | A |
| 5 | 1-22 | d-4 | 1.88 | A |
| 6 | 2-43 | d-4 | 1.88 | A |
| 7 | 2-14 | d-3 | 1.88 | A |
| 8 | 1-9 | d-3 | 1.91 | A |
| 9 | 2-14 | d-2 | 1.92 | A |
| 10 | 3-4 | d-4 | 1.94 | A |
| 11 | 1-9 | d-2 | 1.95 | A |
| 12 | 1-23 | d-4 | 2.00 | A |
| 13 | 1-24 | d-4 | 2.07 | A |
| 14 | 2-14 | d-4 | 2.13 | A |
| 15 | 1-9 | d-4 | 2.16 | A |

Comparative Examples 1 to 9

Photoelectric conversion elements were produced in the same manner as in Exemplary Embodiment 1 except that the combinations of the first organic compound and the second organic compound listed in Table 5 were used. The combinations of the compounds listed in Table 5 had ΔE<1.79 V. The dark current of the photoelectric conversion elements was evaluated in the same manner as in Exemplary Embodiment 1.

TABLE 5

| Comparative example | First organic compound | Second organic compound | ΔE | Rating |
|---|---|---|---|---|
| 1 | 1-7 | d-4 | 1.71 | C |
| 2 | 1-8 | d-4 | 1.71 | C |
| 3 | 3-2 | d-4 | 1.71 | B |
| 4 | 3-4 | d-2 | 1.73 | B |
| 5 | 1-13 | d-4 | 1.73 | B |
| 6 | 2-1 | d-4 | 1.74 | B |
| 7 | 2-2 | d-4 | 1.75 | B |
| 8 | e-1 | d-2 | 1.75 | B |
| 9 | 1-23 | d-3 | 1.75 | B |
| 10 | 1-16 | d-4 | 1.77 | B |

The compound e-1 in Comparative Example 8 has the following structure.

(7)

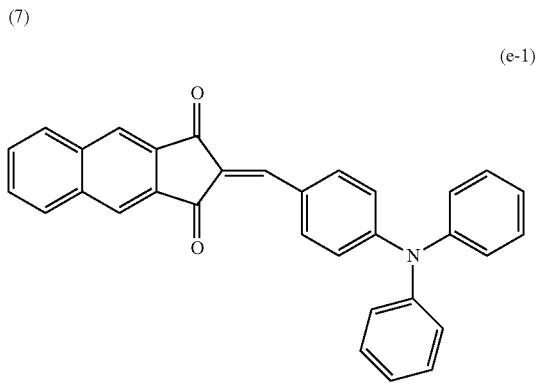

(e-1)

The photoelectric conversion elements satisfying ΔE of 1.79 V or more had dark current ratings of A and had low dark current characteristics.

Exemplary Embodiment 16

Figure 6:
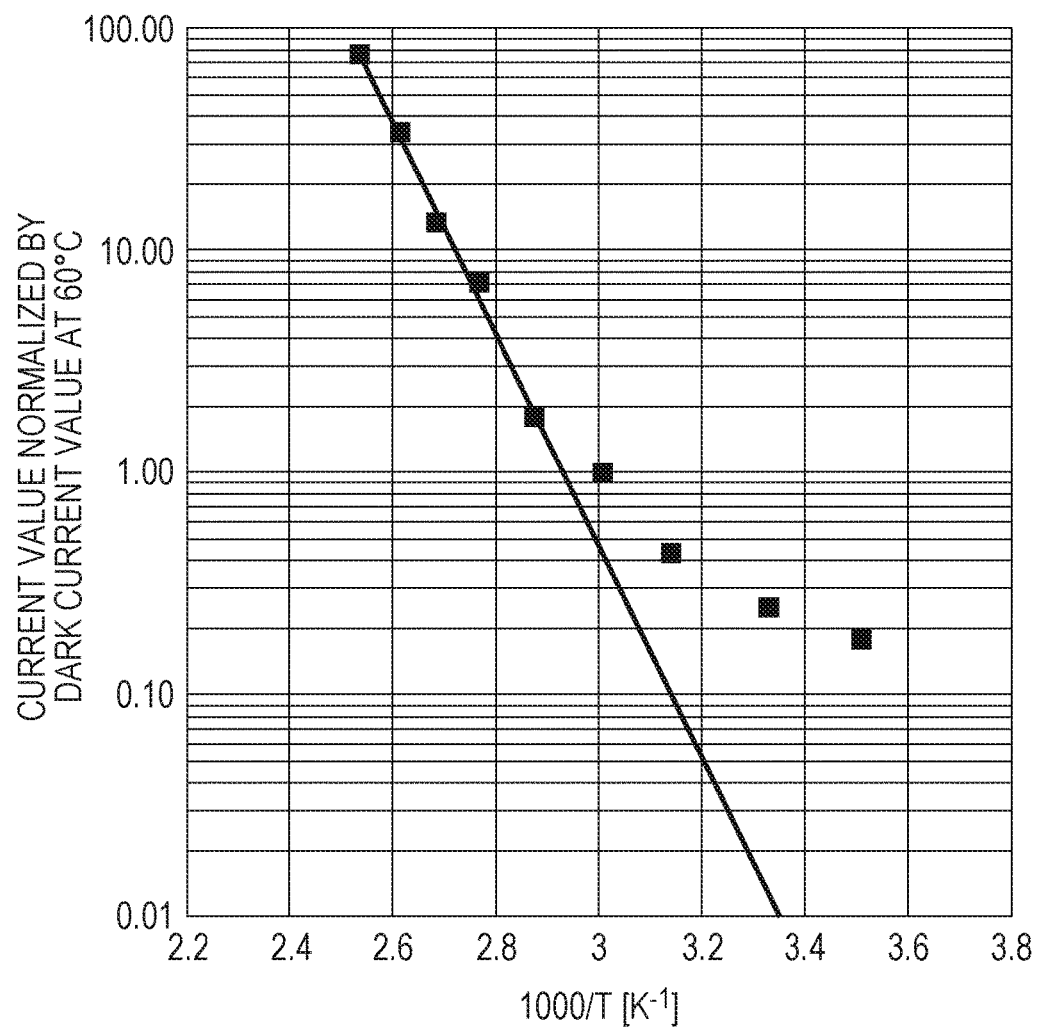
FIG. 6 is an Arrhenius plot of the dark current of a photoelectric conversion element containing an organic compound according to an embodiment of the present disclosure.

The temperature dependence of dark current was measured in the photoelectric conversion element according to Exemplary Embodiment 1. FIG. 6 is an Arrhenius plot of the photoelectric conversion element according to Exemplary Embodiment 1. The ordinate axis is the dark current value normalized by the dark current value at 60° C. The scale of the ordinate axis is the common logarithm. The abscissa axis is the reciprocal of absolute temperature. In FIG. 6, the absolute value of inclination increases at a temperature of approximately 60° C. or more. The activation energy was determined from the inclination using the following formula (5):

$$\ln J(T) = -\frac{E_a}{k_B}\frac{1}{T} + \ln J_0 \tag{5}$$

wherein T: absolute temperature, $k_B$: Boltzmann constant, $E_a$: activation energy, J: the current value at a temperature T, and $J_0$: frequency factor. The activation energy of dark current determined from the inclination was 0.84 eV.

Exemplary Embodiment 17

Figure 7:
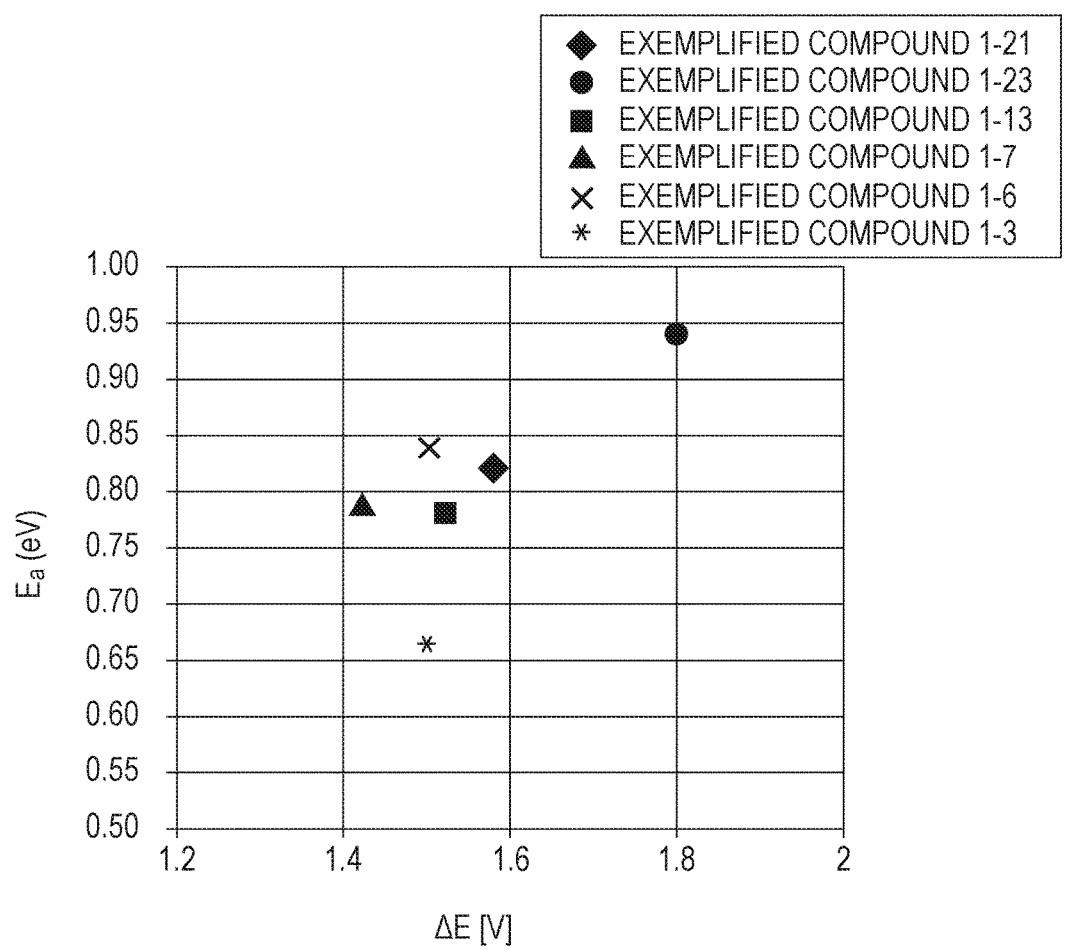
FIG. 7 is a graph showing the relationship between the activation energy ($E_a$) of dark current and $\Delta E$ in a photoelectric conversion element containing an exemplified compound.

Photoelectric conversion elements were produced in the same manner as in Exemplary Embodiment 1 except that the exemplified compounds 1-3, 1-7, 1-13, 1-21, and 1-23 were used as the first organic compound. The activation energy of dark current was determined in the same manner as in Exemplary Embodiment 16. FIG. 7 shows the relationship between activation energy ($E_a$) and ΔE. FIG. 7 shows that ΔE of 1.79 V or more results in high activation energy. This indicates that ΔE of 1.79 V or more results in a low charge generation probability due to thermal excitation.

Exemplary Embodiment 18

A photoelectric conversion element was produced in the same manner as in Exemplary Embodiment 1 except that the sealing layer was a silicon nitride layer formed by a CVD method. The silicon nitride layer had a thickness of 1 μm. The durability of the element was evaluated under irradiation with 365-nm LED light at an intensity of 1 W/cm² for 24 h.

The absorptivity of the formed SiN (1 μm) was 75% at 365 nm. The element had the same dark current after 24 h.

The dark current in the photoelectric conversion element according to Exemplary Embodiment 1 was increased by approximately 10% by light irradiation for 24 hours. This is because the ultraviolet absorptivity of the glass cap is lower than that of SiN. Thus, the sealing layer may be formed of a material that can absorb ultraviolet light.

These exemplary embodiments prove that the photoelectric conversion elements according to the present exemplary embodiments have reduced dark current. Image pick-up elements including these photoelectric conversion elements can have low dark current noise caused by the photoelectric conversion elements.

The present disclosure can provide an organic photoelectric conversion element that generates a reduced dark current between a p-type organic semiconductor material and an n-type organic semiconductor material in a photoelectric conversion layer of the photoelectric conversion element.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-220715 filed Nov. 11, 2016, which is hereby incorporated by reference herein in its entirety.

What is claimed is:

1. A photoelectric conversion element comprising:
a lower electrode;
a photoelectric conversion layer; and
an upper electrode in this order,
wherein the photoelectric conversion layer contains a first organic compound and a second organic compound,
the first organic compound has a lower oxidation potential than the second organic compound, and ΔE represented by the following formula (A) satisfies the following formula (B)

ΔE=oxidation potential of first organic compound−
    reduction potential of second organic compound    (A)

ΔE≥1.79[V]    (B).

2. The photoelectric conversion element according to claim 1, wherein the first organic compound has an oxidation potential of 0.96 V or more.

3. The photoelectric conversion element according to claim 1, wherein the first organic compound constitutes less than 35% by weight of the first organic compound and the second organic compound.

4. The photoelectric conversion element according to claim 1, wherein the first organic compound is one of an organic compound having a heterocyclic group with a 5-membered ring containing a sulfur atom, an organic compound with a fluoranthene skeleton, and a metallic complex.

5. The photoelectric conversion element according to claim 1, wherein the second organic compound is a fullerene derivative.

6. The photoelectric conversion element according to claim 5, wherein the fullerene derivative is fullerene C60.

7. The photoelectric conversion element according to claim 1, further comprising a sealing layer on the upper electrode.

8. An image pick-up element comprising:
a plurality of pixels; and
a signal-processing circuit coupled to the pixels,
wherein the pixels include the photoelectric conversion element according to claim 1 and a readout circuit coupled to the photoelectric conversion element.

9. An image pick-up apparatus comprising:
an optical unit with a plurality of lenses; and
an image pick-up element configured to receive light passing through the optical unit,
wherein the image pick-up element is the image pick-up element according to claim 8.

10. The image pick-up apparatus according to claim 9, further comprising a receiver configured to receive an external signal.

11. The image pick-up apparatus according to claim 10, wherein the signal controls at least one of an image pick-up region, a start of image pick-up, and an end of image pick-up of the image pick-up apparatus.

12. The image pick-up apparatus according to claim 9, further comprising a transmitter configured to transmit information to an outside.

* * * * *